United States Patent [19]

Mendel

[11] Patent Number: 6,080,204

[45] Date of Patent: Jun. 27, 2000

[54] METHOD AND APPARATUS FOR CONTEMPORANEOUSLY COMPILING AN ELECTRONIC CIRCUIT DESIGN BY CONTEMPORANEOUSLY BIPARTITIONING THE ELECTRONIC CIRCUIT DESIGN USING PARALLEL PROCESSING

[75] Inventor: David Wolk Mendel, Sunnyvale, Calif.

[73] Assignee: Altera Corporation, San Jose, Calif.

[21] Appl. No.: 08/958,670

[22] Filed: Oct. 27, 1997

Related U.S. Application Data

[60] Provisional application No. 60/029,277, Oct. 28, 1996, and provisional application No. 60/062,036, Oct. 10, 1997.

[51] Int. Cl.$^7$ .................................................. G06F 17/50
[52] U.S. Cl. ........................................ 716/7; 716/3; 717/6
[58] Field of Search ........................ 395/900.04, 900.34, 395/500.35, 500.36, 705, 706, 500.19

[56] References Cited

U.S. PATENT DOCUMENTS

| | | | |
|---|---|---|---|
| 3,617,714 | 11/1971 | Kernighan | 395/500.08 |
| 5,111,413 | 5/1992 | Lazansky et al. | 395/500.35 |
| 5,301,318 | 4/1994 | Mittal | 395/701 |
| 5,335,320 | 8/1994 | Iwata et al. | 395/704 |
| 5,341,308 | 8/1994 | Mendel | 395/500.08 |
| 5,436,849 | 7/1995 | Drumm | 395/500.19 |
| 5,442,790 | 8/1995 | Nosenchuck | 395/707 |
| 5,499,192 | 3/1996 | Knapp et al. | 395/500.18 |
| 5,513,124 | 4/1996 | Trimberger et al. | 395/500.08 |
| 5,537,295 | 7/1996 | Van Den Bout et al. | 361/767 |
| 5,541,849 | 7/1996 | Rostoker et al. | 395/500.19 |
| 5,550,782 | 8/1996 | Cliff et al. | 365/230.03 |
| 5,557,533 | 9/1996 | Koford et al. | 395/500.1 |
| 5,583,759 | 12/1996 | Tredennick et al. | 705/45 |
| 5,636,133 | 6/1997 | Chesebro et al. | 395/500.05 |
| 5,661,660 | 8/1997 | Freidin | 395/500.02 |

(List continued on next page.)

OTHER PUBLICATIONS

Limaiem and Ammar, "A Computer Assisted Process Planning System Based on Optimization Criteria Compromises," IEEE International Symposium on Assembly and Task Planning, pp. 101–108, 1995.

Mace and Diamond, "Use of Programmable Logic Devices as an Aid to System Design," IEEE Colloquium on Programmable Logic Devices for Digital Systems Implementation, pp. 1/1–1/5, 1990.

Ginetti and Brasen "Modifying the netlist after Placement for Performance Improvement," 1999 IEEE Custom Integrated Circuits Conference, pp. 9.2.1 through 9.2.4, 1993.

John Villasenor, et al., "Configurable Computing," Jun. 1997, pp. 67–71, *Scientific American*.

Peter Ramyalal Suaris, et al., "A Quadrisection–Based Combined Place and Route Scheme for Standard Cells," Mar. 1989, pp. 234–244, *IEEE*.

Primary Examiner—Paul R. Lintz
Assistant Examiner—Vuthe Siek
Attorney, Agent, or Firm—Beyer Weaver & Thomas, LLP

[57] ABSTRACT

Disclosed are various techniques for deploying multiple processing resources, operating in parallel, to compile electronic designs. The disclosed methods identify "compilation tasks" that can be performed in isolation from the remainder of a large "compilation project." When one of these stand alone compilation tasks is identified, it can be temporarily segregated and performed by one or more processors which are not working on other tasks. Simultaneously, the remainder of the project compiles under one or more other processors. One class of severable compilation projects includes those projects that contain multiple full compilation tasks, each of which involves compiling a single design from start to finish. Another class of divisible compilation projects includes those projects in which the logical hierarchy of an electronic design provides the boundaries between isolated compilation tasks. Yet another class of divisible compilation projects are projects in which the tasks are divided out based upon an architecture of a target hardware device.

35 Claims, 11 Drawing Sheets

U.S. PATENT DOCUMENTS

| | | | |
|---|---|---|---|
| 5,670,895 | 9/1997 | Kazarian | 326/39 |
| 5,691,912 | 11/1997 | Duncan | 395/500.12 |
| 5,696,454 | 12/1997 | Trimberger | 326/38 |
| 5,712,794 | 1/1998 | Hong | 395/500.35 |
| 5,721,912 | 2/1998 | Stepczyk et al. | 707/102 |
| 5,724,251 | 3/1998 | Heavlin | 395/500.06 |
| 5,754,441 | 5/1998 | Tokunoh et al. | 395/500.12 |
| 5,812,847 | 9/1998 | Joshi et al. | 709/302 |
| 5,825,661 | 10/1998 | Drumm | 395/500.11 |
| 5,831,863 | 11/1998 | Scepanovic et al. | 395/500.1 |
| 5,859,776 | 6/1999 | Sato et al. | 700/121 |
| 5,867,396 | 2/1999 | Parlour | 395/500.19 |
| 5,867,399 | 2/1999 | Rostoker et al. | 395/500.19 |
| 5,870,308 | 2/1999 | Dangelo et al. | 395/500.19 |
| 5,875,112 | 2/1999 | Lee | 395/500.13 |
| 5,896,521 | 4/1999 | Shackleford et al. | 395/500.42 |
| 5,903,475 | 5/1999 | Gupte et al. | 395/500.37 |
| 5,909,376 | 6/1999 | Scepanovic et al. | 395/500.08 |

METHOD AND APPARATUS FOR CONTEMPORANEOUSLY COMPILING AN ELECTRONIC CIRCUIT DESIGN BY CONTEMPORANEOUSLY BIPARTITIONING THE ELECTRONIC CIRCUIT DESIGN USING PARALLEL PROCESSING

CROSS REFERENCE TO RELATED APPLICATIONS

This application claims priority of provisional U.S. patent application Ser. No. 60/029,277, filed Oct. 28, 1996, entitled "TOOLS FOR DESIGNING PROGRAMMABLE LOGIC DEVICES" which is incorporated by reference.

This application also claims priority of provisional U.S. patent application Ser. No. 60/062,036, filed Oct. 10, 1997, entitled "PARALLEL PROCESSING FOR CAD" which is incorporated by reference.

This invention is related to U.S. patent application Ser. No. 08/958,002, filed on the same day as this patent application, naming B. Pedersen et al. as inventors, and entitled "GENERATION OF SUB-NET LISTS FOR USE IN INCREMENTAL COMPILATION." That application is incorporated herein by reference in its entirety and for all purposes.

This invention is also related to U.S. patent application Ser. No. 08/958,436, filed on the same day as this patent application, naming J. Tse et al. as inventors, and entitled "FITTING FOR INCREMENTAL COMPILATION OF ELECTRONIC DESIGNS." That application is incorporated herein by reference in its entirety and for all purposes.

This invention is also related U.S. patent application Ser. No. 08/958,626, filed on the same day as this patent application, naming F. Heile et al. as inventors, and entitled "INTERFACE FOR COMPILING DESIGN VARIATIONS IN ELECTRONIC DESIGN ENVIRONMENTS." That application is incorporated herein by reference in its entirety and for all purposes.

This invention is also related to U.S. patent application Ser. No. 08/958,778, filed on the same day as this patent application, naming T. Southgate as inventor, and entitled "METHOD AND APPARATUS FOR AUTOMATED CIRCUIT DESIGN." That application is incorporated herein by reference in its entirety and for all purposes.

This invention is also related to U.S. patent application Ser. No. 08/958,434, filed on the same day as this patent application, naming T. Southgate et al. as inventors, and entitled "GRAPHIC EDITOR FOR BLOCK DIAGRAM LEVEL DESIGN OF CIRCUITS." That application is incorporated herein by reference in its entirety and for all purposes.

This invention is also related to U.S. patent application Ser. No. 08/958,432, filed on the same day as this patent application, naming T. Southgate et al. as inventors, and entitled "DESIGN FILE TEMPLATES FOR IMPLEMENTATION OF LOGIC DESIGNS." That application is incorporated herein by reference in its entirety and for all purposes.

This invention is also related to U.S. patent application Ser. No. 08/958,414, filed on the same day as this patent application, naming T. Southgate as inventor, and entitled "METHOD FOR PROVIDING REMOTE SOFTWARE TECHNICAL SUPPORT." That application is incorporated herein by reference in its entirety and for all purposes.

This invention is also related to U.S. patent application Ser. No. 08/958,777, filed on the same day as this patent application, naming T. Southgate as inventor, and entitled "METHOD FOR SIMULATING A CIRCUIT DESIGN" That application is incorporated herein by reference in its entirety and for all purposes.

This invention is also related to U.S. patent application Ser. No. 08/957,957, filed on the same day as this patent application, naming F. Heile et al. as inventors, and entitled "WORKGROUP COMPUTING FOR ELECTRONIC DESIGN AUTOMATION." That application is incorporated herein by reference in its entirety and for all purposes.

This invention is also related to U.S. patent application Ser. No. 08/958,798, filed on the same day as this patent application, naming F. Heile as inventor, and entitled "LOCAL COMPILATION IN CONTEXT WITHIN A DESIGN HIERARCHY." That application is incorporated herein by reference in its entirety and for all purposes.

This invention is also related to U.S. patent application Ser. No. 08/958,435, filed on the same day as this patent application, naming Alan L. Herrmann et al. as inventors, and entitled "EMBEDDED LOGIC ANALYZER FOR A PROGRAMMABLE LOGIC DEVICE." That application is incorporated herein by reference in its entirety and for all purposes.

This invention is also related to U.S. patent application Ser. No. 08/958,431, filed on the same day as this patent application, naming F. Heile as inventor, and entitled "ELECTRONIC DESIGN AUTOMATION TOOL FOR DISPLAY OF DESIGN PROFILE." That application is incorporated herein by reference in its entirety and for all purposes.

BACKGROUND OF THE INVENTION

This invention relates to compilation of electronic designs. More specifically, it relates to methods, machine readable media, and apparatuses for rapidly compiling electronic designs via parallel processing.

Electronic design automation ("EDA") is becoming increasingly complicated and time consuming, due in part to the greatly increasing size and complexity of the electronic devices designed by EDA tools. Such devices include general purpose microprocessors as well as custom logic devices including Application Specific Integrated Circuits ("ASICs"). Examples of ASICs include non-programmable gate arrays, field programmable gate arrays ("FPGAs"), and complex programmable logic devices ("PLDs" or "CPLDs"). The design of even the simplest of these devices typically involves generation of a high level design, logic simulation, generation of a network, timing simulation, etc. Usually, timing simulation cannot be performed until the design has been compiled to the point where the various gate level entities are synthesized and placed and the lines therebetween routed on a target hardware device. This compilation requires that a design project (or a significant piece of it) be functionally completed.

Meeting timing requirements is essential to the correct operation of an integrated circuit. For example, for a plurality of D-type flip-flops ("DFFs") to feed through some logic to another plurality of DFFs, it is generally required that the signals form the first set of DFFs must finish propagating through any intermediate logic and have settled to their final state on the D-input of each of the destination DFFs before the next rising edge of the clock. (In fact they must finish before the next clock edge by an amount known as the setup delay of the register $T_{su}$.) If the delay through the resulting logic is greater than the time between rising clock edges, then the state that the destination DFFs will hold on the next clock edge will be undefined.

Quite typically, a designer (or the compiler itself) will modify a design after an initial compilation. This may be required when a timing simulation conducted after compilation indicates a problem. Or, the product requirements may change in the middle of the device's development. Regardless of why a design change is necessary, that change requires a recompile. Unfortunately, each compilation consumes significant time, so multiple recompiles translates to significantly longer development times. This can greatly slow the time to market for an integrated circuit under design. Because PLDs rely on a short time to market as a major selling point, slow development can erase any commercial advantage.

The problem is compounded because maximum CPLD device sizes are increasing at a speed slightly greater than that predicted by Moore's law (i.e., each new chip contains roughly twice as much capacity as its predecessor, and each chip is released within 18–24 months of the previous chip). If compilation time was a linear function of design size then it would be expected that the time to compile the largest device on the most powerful computer would remain approximately constant. Unfortunately, compile times are typically proportional to $n^2$, where n is the number of logic elements on a device. This means that a design twice as big takes four times as long to compile. Consequently, the compile times for the largest devices are accelerating. It is not uncommon for large projects to compile for about 24 hours or more on a modern workstation. Obviously, the fastest compilers will become critical components of integrated circuit design environments.

Large designs often benefit from performing and comparing multiple compilations, each based upon a different compilation parameters or slight design changes. For example, the heuristics for synthesizing and/or the heuristics for mapping a design can be varied to emphasize different goals (e.g., speed versus compact fit). Obviously, given long compile times, most designers do not have the luxury of running multiple compilations for comparison.

An important advance in the effort to reduce compilation time for large devices is incremental compilation. In essence, incremental compilation involves using a previously compiled design such that only a fraction of that design must be recompiled after a user or compiler makes one or more changes to the design. Incremental compilation requires at least two steps: (1) delineating a sphere of influence of user changes in a previously compiled design (the sphere of influence typically being defined within a netlist), and (2) recompiling the logic from within this sphere of influence into appropriate logic elements available within a target hardware device. To maximize efficiency, the compiler should limit recompile to a minimum region of the electronic design (and a corresponding region of a target hardware device) which is directly affected by the design change.

One suitable technique for delineating a sphere of influence of user changes to a previously compiled design (step 1) involves a "netlist differencing" method in conjunction with a "sub-netlist" identification method. Given a change to a design, the compiler can re-extract the netlist, run netlist differencing on the netlist to identify which nodes and/or nets have actually changed. Netlist differencing is described in U.S. patent application Ser. No. 08/619,073, filed on Mar. 20, 1996, naming Lee as inventor and entitled "METHODS FOR IMPLEMENTING CIRCUIT DESIGNS IN PHYSICAL CIRCUITS." Because the effects of the user's changes propagate beyond those nodes/nets that were actually changed, the compiler uses an appropriate technique for expanding the changed portion of the design beyond the design entities identified by netlist differencing. One suitable technique for identifying the sphere of influence of the changes is the sub-netlist method as described in U.S. patent application Ser. No. 08/958,002, filed on the same day as the instant patent application, naming B. Pedersen et al. as inventors and entitled "GENERATION OF SUB-NET LISTS FOR USE IN INCREMENTAL COMPILATION." The now delineated changed portion of the design may resynthesized, remapped, and refit (step 2). A suitable technique for fitting changed cells is described in U.S. patent application Ser. No. 08/958,436, filed on the same day as the instant patent application, naming J. Tse et al. as inventors and entitled "FITTING FOR INCREMENTAL COMPILATION OF ELECTRONIC DESIGNS." All three of the above applications are incorporated herein by reference for all purposes.

While the above-described incremental compile techniques help reduce the time devoted to compiling designs, other techniques for decreasing compile time would be quite welcome.

SUMMARY OF THE INVENTION

The present invention provides various techniques for deploying multiple processing resources, operating in parallel, to compile electronic designs. The invention also provides compilers for executing these techniques. Part of the invention resides in identifying "compilation tasks" that can be performed in isolation from the remainder of a large "compilation project." When one of these stand alone compilation tasks is identified, it can be temporarily segregated and performed by one or more processors which are not working on other tasks. Simultaneously, the remainder of the project compiles under one or more other processors.

In one aspect, the invention may be characterized as a method of compiling a design with parallel processing such that the method includes the following: (a) providing a compilation project including first and second compilation tasks; (b) allocating a first processing resource for running the first compilation task; (c) allocating a second processing resource, which is separate from the first processing resource, for running the second compilation task; and (d) contemporaneously running the first compilation task on the first processing resource and running the second compilation task on the second processing resource.

One way a compilation project can be partitioned is between full independent compilations of one or more electronic designs. In this approach, each full compilation serves as a severable compilation task. In this embodiment, the first and second electronic designs may be different. Alternatively, the two electronic designs may be the same, in which case the first task is a full compilation of the electronic design under a first compiler setting and the second task is a full compilation of the same electronic design under a second compiler setting. Examples of different compiler settings include different heuristics for performing a compiler operation such as synthesis, technology mapping, partitioning, netlist extraction, and state machine processing.

Another way a compilation project can be partitioned is between entities within a logical hierarchical design. Here, at least two separate children entities within the hierarchical design serve as separate compilation tasks. In this case, the first compilation task may involve one or more of synthesizing logic of the first child logical entity, technology mapping of logic of the first child logical entity, and netlist extraction of logic for the first child logical entity. Often the logical hierarchical design will be sufficiently complex, that new compilation tasks will be identified while proceeding through the design hierarchy. This is not surprising when the tree structure of most hierarchies is considered. Preferably, when the compiler identifies such new tasks, it will allocate additional processing resources to run those tasks in parallel with other tasks.

Yet another way a compilation project can be divided for parallel processing is between regions of one or more target hardware devices. For example, a compilation project may require partitioning an electronic design between at least three regions of the one or more target hardware devices. And, the first compilation task includes performing a bipartitioning routine on a first pair of the at least three regions and the second compilation task includes performing the bipartitioning routine on a second pair of the at least three regions. In another example, the compilation project includes fitting portions of the electronic design onto at least two regions of the one or more target hardware devices. And, the first compilation task includes fitting a first portion of the electronic design on a first region of the one or more target hardware devices, and the second compilation task includes fitting a second portion of the electronic design on a second region of the one or more target hardware devices. The regions may define some internal architectural features of a chip such as a row or logic array block. Alternatively, the regions may define individual chips when a design is too large to fit on a single chip.

Still further, the a compilation project may be carved up for parallel processing by defining tasks based upon independent logical regions of a design that are isolated from one another by registers. In this scenario, first and second independent regions may include separate stages of pipelined logic, each compiled in parallel as a separate task. In another embodiment, the first and second independent regions may be separated by a state machine.

Further details and advantages of the invention are provided in the following Detailed Description and the associated figures.

DETAILED DESCRIPTION OF THE PREFERRED EMBODIMENTS

DEFINITIONS

Figure 1:
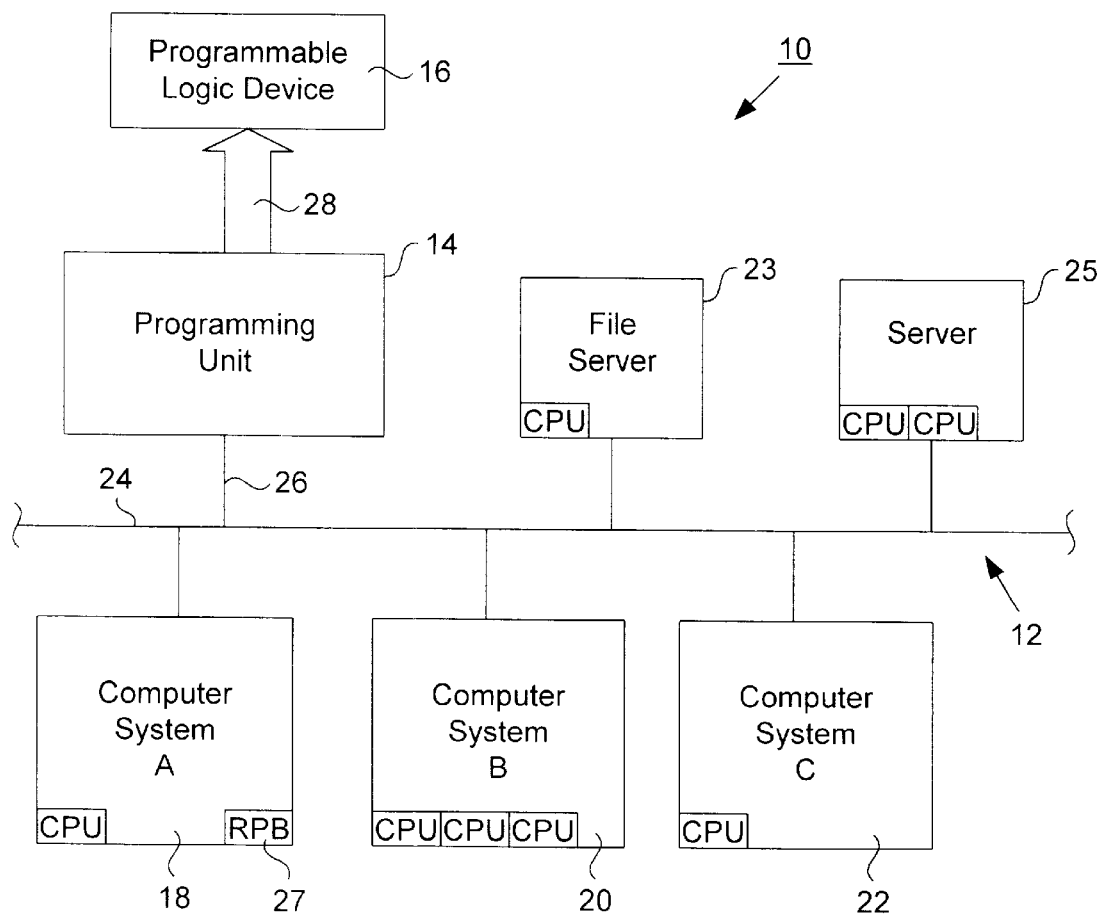
FIG. 1 is a block diagram of a programmable logic development environment having parallel processing capabilities according to one embodiment of the present invention

Some of terms used herein are not commonly used in the art. Other terms have multiple meanings in the art. Therefore, the following definitions are provided as an aid to understanding the description that follows. The invention as set forth in the claims should not necessarily be limited by these definitions.

The term "compiler" is used throughout this specification to refer to software—and apparatus for running such software—that compiles an electronic design. Its functions may include extracting and synthesizing a netlist, mapping the design to a given hardware architecture, fitting the design, simulating the design, etc.

As used herein, the phrase "compilation project" or "compile project" refers to a relatively large but divisible electronic design or group of designs that is to be compiled. For example, one compilation project is the full compilation of a single design which has separable parts capable of being compiled in isolation. The parts may be different logic entities existing at a level in a design hierarchy or they may be different physical features in a hardware device architecture (e.g., rows of logic cells), for example. Another example of a compilation project is the compilation of multiple related but distinct designs. Yet another example of a compilation project is the compilation of a single design multiple times, each time with a different compiler setting. An important feature here is that the compilation project cleanly breaks into multiple tasks, each of which can be compiled or recompiled in isolation.

A "compilation task" is one of the stand-alone parts into which the compilation project can be broken. As explained above, it can be compiled in isolation of some other tasks of the compilation project. Thus, one or more processors can work on a given compilation task without being saddled with other compilation tasks of the compilation project.

The term "electronic design" generically refers to the logical structure of an electronic device such as an integrated circuit. It may be implemented on hardware (usually referred to herein generically as a "target hardware device"). During the design and development effort, an electronic design may exist in various states or stages. It may be provided as a high level Boolean representation (encoded in a hardware design language for example), a schematic or circuit representation, or any other form representing the logical arrangement of a device. It may include other facets such as floor-plan constraints, wave-form constraints, timing constraints, fitting constraints, etc. At the gate level, it may exist as a netlist (whether synthesized or not) prior to placement on a target hardware device. It may even include completed place and route assignments.

A "netlist" is used to describe the functionality of a digital circuit design that can be implemented on a programmable logic device or other target hardware device. The netlist is represented as hierarchical collection of gates, state machines, high level constructs such as counters or adders, or any other means of defining a collection of outputs based on a collection of inputs. The nodes of the netlist (gates, state machines, etc.) are connected together via nets. Each of these nets is associated with a named digital signal. A netlist may be synthesized to remove redundant logic, simplify the gate layout provided by a user, etc.

When in the form of a synthesized netlist, an electronic design may be divided into "logic cells" representing various logic functions within the electronic design. During compilation, these logic cells are mapped onto physical structures known as "logic elements" which reside on the target hardware device. The criteria for mapping gates into logic cells is that the resulting logic cell must be able to be put into one logic element. An example of a logic cell is a collections of gates (connected in some way and implemented in a look-up table) combined with a register and configured to implement a multiplexer.

The term "target hardware device" refers to a hardware device on which an electronic design is implemented. Examples include circuit boards and systems including multiple electronic devices and multi-chip modules, as well as integrated circuits. Specific examples of integrated circuits include traditional integrated circuits with full custom layouts, hardwired ASICs (e.g., gate arrays) designed with high level design tools, and programmable ASICs such as FPGAs and PLDs. In the case of non-programmable integrated circuits such as gate arrays, the electronic design defines the arrangement of metal lines on one or more metallization layers of the target hardware device. In the case of programmable integrated circuits such as PLDs, the electronic design defines the gates as well as interconnects to be programmed on the target hardware device.

In the context of this invention, a target hardware device typically includes a plurality of logic elements which house logic cells from an electronic design in order to implement the logic functions specified by these cells. The logic elements are typically a fundamental element of the hardware device's architecture on which different logic gates can be defined. These elements may be grouped into blocks such that each logic element is associated with a block (or other arbitrary containment entity). There may be higher level organization in the device such that logic blocks are grouped into rows or some other arbitrary entity.

In the case of a FLEX 10K CPLD (available from Altera Corporation of San Jose, Calif.), for example, logic elements are provided at the bottom level of a containment hierarchy. In this architecture, multiple logic elements are grouped into logic array blocks (LABs), which are in turn organized into half-rows, which are in turn organized into rows. By way of contrast, in the case of the XC4000 (available from Xilinx Corporation of San Jose, Calif.) logic elements are provided in a flat grid without a hierarchical structure.

Examples of logic elements include a product term macrocell employed in the MAX 9000 family of CPLDs available from Altera Corporation and a look up table ("LUT") employed in the FLEX 10K and FLEX 8000 families of CPLDs (Altera Corporation). These logic elements are described in the Altera 1996 Data Book, available from Altera Corporation of San Jose, Calif. The Data Book is incorporated herein by reference for all purposes. Another example of a logic element is the multiplexer-based element employed in some devices available from Actel Corporation of Sunnyvale, Calif. Those of skill in the art will recognize that many other logic elements are known and may be used with this invention.

The term "fitting" is used throughout this specification to describe a process whereby a compiler fits an electronic design onto a target hardware device. The term "fit" may be used interchangeably with the phrase "place and route." As this synonym suggests, fitting can be divided into two phases: a placement phase and a routing phase. The present invention is concerned primarily with the placement phase of the fitting procedure. At this phase, a compiler positions logic cells of the electronic design with respect to logic elements of a target hardware device. The invention may employ generic place and route algorithms—including many conventional and commercially available algorithms—employed during design development.

In some design environments, a user may control the fit of design by assigning logic to a particular pin or logic cell. In addition, some environments allow relative assignments where the relative location of one cell to another is specified without giving an absolute assignment. One example is a "clique" as used in the MAX+ II CPLD development software (available from Altera Corporation) in which a group of logic cells can all be assigned to the same hierarchical hardware feature (e.g. a logic array block or row in the FLEX 10K architecture) without naming the feature to which they are assigned. More generally, any relative spatial relationship could be specified such as "logic cell A should be two down and one to the right of logic cell B." These kinds of assignments can be useful for example in making optimal use of the local routing provided in the EPF6000 device family provided by Altera Corporation.

PROGRAMMABLE LOGIC DEVELOPMENT ENVIRONMENT

FIG. 1 is a block diagram of a programmable logic development environment 10 having multiple processing resources (e.g., CPUs) that can be deployed for parallel processing a compilation project in accordance with this invention. Environment 10 includes a computer network 12, a programming unit 14, and a programmable logic device 16 that is to be programmed. Computer network 12 includes any number of computers connected in a network such as a computer system A 18, a computer system B 20, a computer system C 22, a computer system file server 23, and a computer system server 25 all connected through a network connection 24. Each computer, including servers 23 and 25 may include one or more CPUs. Note that computer system 20 is shown having three CPUs and server 25 is shown having two CPUs. Still further, computer system 18 includes a "reconfigurable processing board" 27 (described below). It should also be noted that not all computers shown in a network need be identical so long as they are capable of interfacing with the server. For example some computers could be personal computers while others could be workstations.

Design teams may use the resources of a computer network in various manners. For example, at least some of the computer systems of network 12 (e.g., computer systems 18, 20, and 22) could be workstations assigned to individual members of a design team. Possibly these computers reside in the cubicles or offices of the engineers to whom they are assigned. Alternatively, some of the computer systems could be dedicated to certain tasks. For example, computer system 22 might be used primarily for floor-plan editing, computer 20 might be used primarily for running timing simulations, etc. Regardless of how the individual computers of the network are used, individual CPUs of the network will be idle from time-to-time. Often late at night, for example, many CPUs are unused. Thus, the average engineering department has significant untapped network compute power available at certain times. The present invention makes use of this untapped power to speed the compilation process. It does this by running multiple processors in parallel during a compilation project.

Note that the parallel processing environment of this invention may employ two or more servers (two are shown in FIG. 1). In one embodiment, the compilation project is split into two or more compilation tasks, each running under control of a separate server. That servers in turn may control multiple CPUs to execute their own compilation tasks. Further each server could have its own unique database (described below) for its associated compilation task.

One or more of the CPUs on network 12 runs an operating system, EDA applications, and associated compiler. One or more of these software entities manages compilation and controls what process runs on what computational resource. Preferably, the software will consider the resources of each available computer (memory, speed of CPU, access speed to server, number and type of processes already running on the computer, etc.) and estimate the resources that a given process will consume (estimated runtime, memory, I/O to the server, etc.) in deciding which process or processes goes to which computer. When more than one process runs on a single computer, that computer's operating system may decide which process runs on which CPU.

In addition to the multiple CPUs provided on a network such as network 10 shown in FIG. 1, parallel processing could be implemented, at least in part, on "reconfigurable computing resources" such as board 27 shown in FIG. 1. Reconfigurable processing resources are described by Villasenor and Mangione-Smith, "Configurable Computing," Scientific American, June 1997, pp. 66–71 (incorporated herein by reference for all purposes). A reconfigurable computing resource can change its hardware configuration very rapidly during normal computer operation (typically by changing its routing on the fly) so that instructions can be executed very rapidly—typically faster than a comparable CPU executing software instructions. Examples include hardware reconfigurable boards built from programmable logic devices exemplified by the Altera RIP-10 and Altera RIP-20 board (available from Altera Corporation of San Jose, Calif.). Reconfigurable computing resources are described in U.S. Pat. No. 5,537,295 issued to David E. Van den Bout, et al. on Jul. 16, 1996, and entitled "UNIVERSAL RECONFIGURABLE PRINTED CIRCUIT BOARD" and U.S. Pat. No. 5,583,749 issued to Harry L. Tredennick, et al. on Dec. 10, 1996, and entitled "BASEBOARD AND DAUGHTERCARD APPARATUS FOR RECONFIGURABLE COMPUTING SYSTEMS." Both of these references are incorporated herein by reference in their entireties and for all purposes. A reconfigurable resource may be used in a heterogeneous or homogeneous network in which it operates in parallel with other reconfigurable resources and/or conventional CPUs. In one embodiment, one or more reconfigurable resources are earmarked to handle computationally intensive compilation tasks, while CPUs in the network operate on other compilation tasks in parallel with the reconfigurable resource(s).

COMPILATION GENERALLY

While most examples and illustrations presented herein depict PLD design compilation, the methodologies of this invention find application in any electronic design compilation employing a divisible compilation project. In the case of a traditional integrated circuit design created using high level design tools, for example, compilation involves the following steps: (a) synthesis from a hardware design language (e.g., VHDL or Verilog), (b) automatic place and route of a mapped netlist with respect to the target device, and (c) simulations. The present invention may be employed at any one or more of these steps.

During design of a PLD, a user may create an electronic design by specifying and implementing functional blocks. Design entry and processing occurs in the context of a "design project". A design project may include a project file, design files, assignment files, and simulation files, together with hierarchy information, system settings, and output files, which includes programming files and report files. A project database may also exist, which contains intermediate data structures and version information. U.S. patent application Ser. No. 08/957,957 describes the contents of an exemplary design project. That application, which was filed on the same day as the instant application, named Heile et al. as inventors, and is entitled "WORK GROUP COMPUTING FOR ELECTRONIC DESIGN AUTOMATION," is incorporated herein by reference for all purposes. During compilation, a design project as described serves as the input to the compiler for compilation with parallel processing.

Figure 2A:
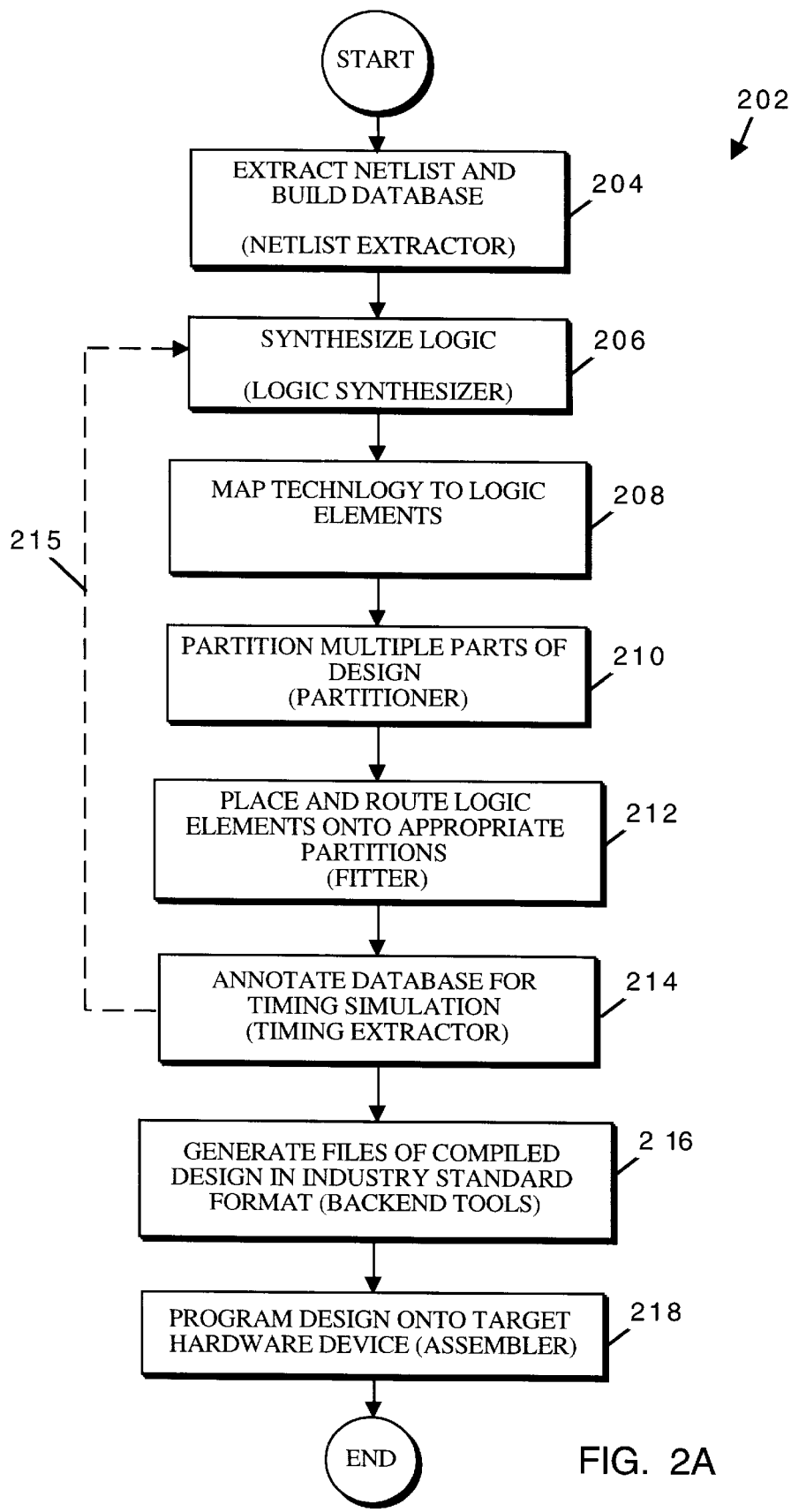
FIG. 2A is a process flow diagram of a non-hierarchical compilation procedure which may be executed via parallel processors in accordance with one embodiment of this invention.
Figure 2B:
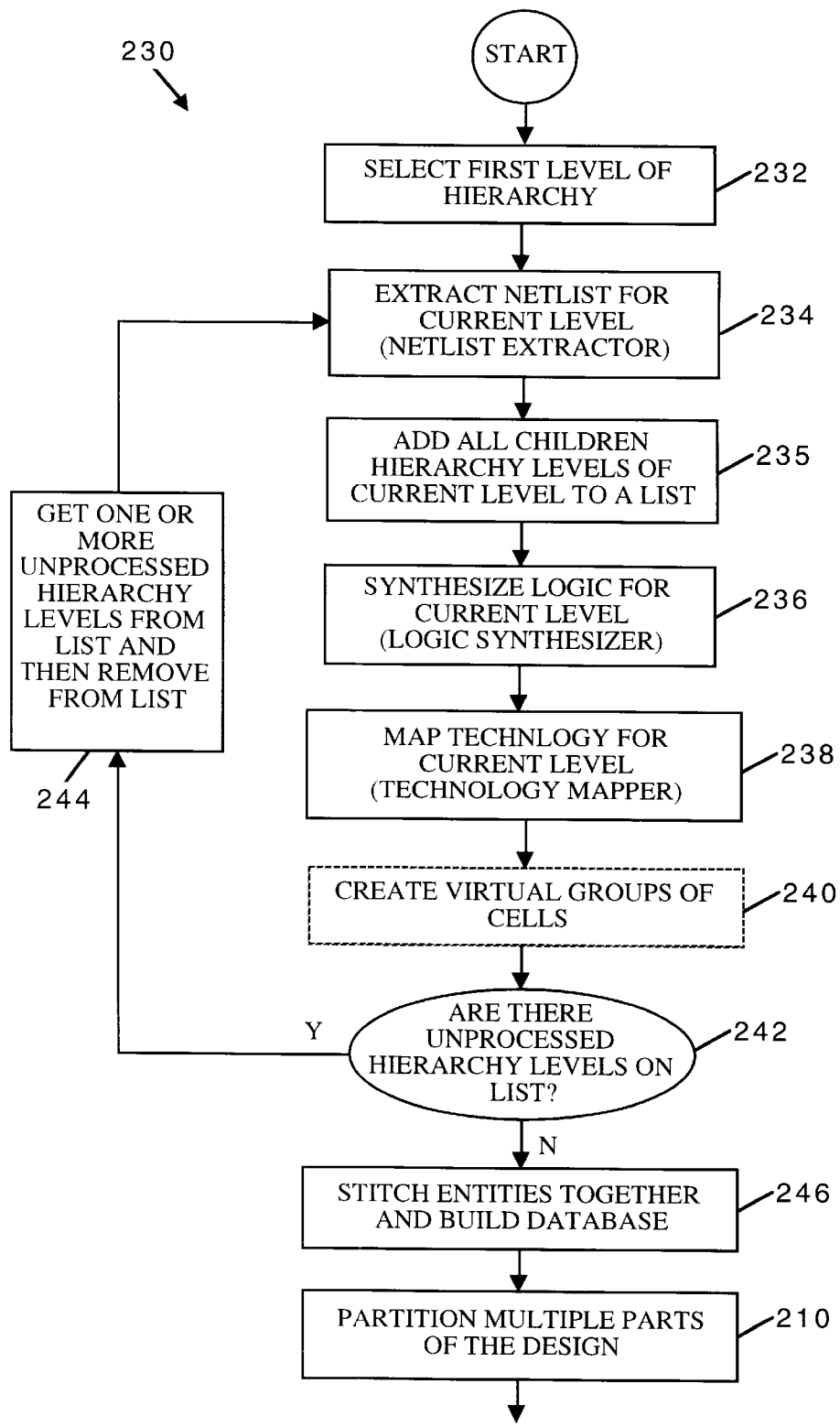
FIG. 2B is a process flow diagram of a hierarchical compilation procedure which may be executed via parallel processors in accordance with one embodiment of this invention.

FIG. 2A depicts a process flow 202 for a non-hierarchical compilation of a programmable logic device. This process flow as well as that shown in FIG. 2B (hierarchical compilation) may be adapted for use with parallel processing methods of this invention. It should be understood that while the process flows depicted in FIGS. 2A and 2B are rather specific for compiling programmable logic devices, compilation procedures for other types of electronic design may possess steps in common or similar to some of those shown in these drawings. Thus, the parallel processing techniques of this invention may also be employed to speed the compilation of these other types of electronic designs.

Turning now to FIG. 2A, a high level design such as that described below is provided to a compiler. First, at a step 204, an unsynthesized netlist is extracted from the design project and used to build a database. The database may be a flat representation (although this is by no means necessary) of the electronic design in the form of a netlist. Typically, netlist extraction begins at the highest or "root" level of the design hierarchy and extracts enough information to identify the children of the root and any assignments applied thereto. Then, the information about the root is added to the database. Thereafter, the compiler (netlist extractor) extracts the appropriate information about the children entities of the root and feeds that information to the database before moving to the next lower level in the design hierarchy. This process continues until the "leaves" of the design hierarchy have been extracted and added to the database. By then, the database includes a complete and flat representation of the unsynthesized netlist.

As mentioned, a netlist is used to describe the functionality of a digital circuit design that can be implemented on a programmable logic device or other target hardware device. The netlist is represented as a hierarchical collection of gates (and sometimes other entities) having inputs and outputs that are connected together via nets. Each of these nets is associated with a named digital signal. At a step 206, a logic synthesizer module of a compiler takes this netlist and simplifies its gate representation by synthesizing it.

The process of simplifying a gate representation consists of performing Boolean manipulations on the netlist: removing redundant gates or replacing the gates of a sub-network of the design with an equivalent network of newly generated "synthesized gates." These synthesized gates do not necessarily have a one-to-one correspondence to any single gate in the original netlist.

While not shown, various other steps may be added to the compilation flow as known to those of skill in the art. For example, there may be a "high level synthesis" step between extraction (step 204) and synthesis (step 206). High level synthesis is a process of manipulating netlists using higher level constructs such as adders and counters rather than gates. Also, either before, during, or after synthesis, the compiler may perform state machine processing. State machine processing defines the encoding for the various states of a state machine. This can affect the amount of logic required to implement the state machine.

After synthesis is complete, at a step 208, a technology mapper module of the compiler maps the gates of the synthesized netlist into logic cells. For each cell, the technology mapper may map one or more gates into a logic cell. As mentioned, each logic cell must be able to be put into one logic element which, as noted, corresponds a basic physical element of the target hardware device (e.g., a PLD).

In some embodiments, blocks 206 and 208 may be combined into a single block (step). If this is the case, the combined block will produce a number of gates in a synthesized netlist and automatically group those gates as logic cells for mapping onto the appropriate hardware unit.

After synthesis and mapping, the electronic design is partitioned into multiple parts (by a partitioner)—if necessary. For example, if upon compilation the compiler determines that the design is too large to fit onto a single hardware device, it will partition the design so that it can fit onto multiple hardware devices. Simultaneously, it will create input/output pins on the various chips to match interchip signals. As explained in more detail below, the partitioner may also partition a design among architectural units within a single chip. For example, a chip may be comprised of multiple rows and the partitioner will partition the design among those rows. Each segment of the partitioned design can then be fit separately. This lends itself nicely to having one or more processors operating in parallel on fitting the various segments of the partitioned design. In FIG. 2A, the partitioning is performed at a step 210.

After partitioning, if necessary, a fitter within the compiler (1) places logic cells at appropriate locations on the appropriate partitions and (2) routes interconnect lines therebetween. See step 212. One suitable technique for fitting is described in U.S. Pat. No. 5,341,308, issued on Aug. 23, 1994, naming D. W. Mendel as inventor, and entitled "METHODS FOR ALLOCATING CIRCUIT ELEMENTS BETWEEN CIRCUIT GROUPS." That application is incorporated herein by reference for all purposes. In general, the fitting process employs heuristics that minimize the space occupied by the logic cells while allowing successful routing between logic elements and meeting the limits of timing, power consumption, etc. Appropriate routing algorithms for programmable logic devices and other electronic designs are known to those of skill in the art. One suitable routing algorithm is described in R. R. Suaris and G. Kedem, "A quadrisection-based combined place and route scheme for standard cells" IEEE Transactions on CAD of Integrated Circuits and Systems, CAD-8(3):234-244, 1989. That reference is incorporated herein by reference for all purposes.

After the electronic design has been placed and routed, a timing extractor within the compiler annotates the design for timing simulation. This may involve, for example, running a resistance/capacitance (RC) model for the various lines interconnecting the elements of the hardware device. This allows the delay to be calculated for various wires. For example, a wire A may require 0.5 nanoseconds to transmit a signal through a point A. It may also require two nanoseconds to transmit that signal to a point B. This information is provided as annotation to the database. Later, a timing simulator can determine whether the compiled design meets prespecified timing requirements.

If a timing simulation indicates that the compiled design (at step 214) does not meet prespecified timing criteria, the compiler may request modification of a critical timing path. The design so modified may then be resynthesized at step 206 as described above. This possibility is depicted by dotted loop back path 215 in FIG. 2A.

Other loop back options may be appropriate. For example, it could be that fitting fails and the compiler loops back to partitioning block 210. Also, if technology mapping does a poor job, it may be necessary to loop back and resynthesize the logic (step 206). In severe cases, it may be necessary to loop all the way back to netlist extraction (step 204) and ask for an alternative representation of the logic.

After the electronic design has been compiled to the satisfaction of the compiler, it may optionally generate files of the compiled design in an industry standard format (e.g., Verilog or Edif) that is indicated at an optional step 216. The portion of the compiler employed to perform this operation is sometimes referred to as "back end tools." The files so generated allow the designer to test his or her compile design on various industry standard tool benches.

Finally, compilation concludes at step 218 where the compiled design is programmed onto a target hardware device. The portion of the compiler performing this operation is sometimes referred to as an assembler. This corresponds to programming unit 14 shown in FIG. 1.

Process flow 202 has the advantage of very rigorously compiling the design in one shot so that disjoint boundaries are avoided. In other words, each of the steps of the process flow are applied to the entire design (not some part of it) from top to bottom of the design hierarchy. Thus, it is not necessary to stitch together precompiled pieces of the design which have been compiled in isolation. Generally, it is expected that this "non-hierarchical" compilation will produce a relatively good compilation (in terms of efficient use of resources, device performance, etc.). However, if the designer does a good job of delineating boundaries at appropriate locations in a design, compilation of the design in accordance with these boundaries may produce an equally good (if not better) compilation. In short, while the non-hierarchical compilation 202 generally does a good job of compiling a design, it does not always lend itself nicely to parallel processing. That is not to say that parallel processing cannot be brought to bear on a non-hierarchical design flow such as flow 202. Rather, parallel processing will have more limited application in that case than in a hierarchical compilation as now described.

Turning now to FIG. 2B, a hierarchical synthesis flow 230 is depicted. Initially, at a step 232, the compiler selects a first level of the hierarchy for extraction, synthesis, and mapping. Typically this will be the root level of a design hierarchy. Next, at a step 234, a netlist extractor extracts the netlist for the current level (in this case the root level). Note that, in distinction from step 204 of FIG. 2A, this step is limited to a single level of the design hierarchy and it does not concurrently build the database to completion. After the netlist for the current level of the hierarchy has been extracted, the compiler knows all children hierarchy entities of the current level. It subsequently adds each of these children to a list at a step 235. Obviously, with each new level extracted, the compiler adds new members to the list—until it encounters leaf entities.

Possibly a hybrid hierarchical and non-hierarchical process flow could be employed in which netlist extraction is performed in a hierarchical manner as illustrated here, while synthesis and the remainder of the process steps follow a non-hierarchical flow as set forth in FIG. 2A.

After step 235, a logic synthesizer synthesizes the logic for current level only. See step 236. Note that high level synthesis and state machine processing may also be performed at this point. After synthesis of the current level, a technology mapper maps any leaves residing in the current level at a step 238. In some cases, particularly at high levels within the hierarchy, there will be no leaves and thus no technology mapping. Often, however, intermediate levels of the hierarchy include gate level logic as well as sub-blocks. That logic, which takes the form of gates and nets, can be mapped independently of the higher level sub-blocks appearing within the current hierarchy level. Note that one of the advantages of performing the technology mapping at this stage is that the mapper runs significantly faster on smaller designs. Therefore, by breaking the design into smaller pieces, the total time spent mapping is reduced during compilation.

Optionally, at a step 240, the compiler may create virtual groups of logic cells. As will be explained in more detail below, some architecture such as the FLEX 10K architecture (employed in some programmable logic devices from Altera Corporation) group logic cells (logic elements) into larger blocks for purposes of efficient routing. In the FLEX 10K architecture, logic elements may be grouped into Logic Array Blocks (LABs), each containing eight logic elements. To speed the compilation process, it is sometimes desirable to perform this grouping before a place and route step. Thus, step 240 is optionally provided at this stage of the process flow.

After the technology mapper is finished with the current level of the design hierarchy, the compiler determines, at a decision step 242, whether there are any hierarchy entities remaining on the list. If so, the compiler loops back to step 234 via a step 244. In step 244, the compiler gets one or more unprocessed hierarchy entities from list and then removes them from the list. Each of the hierarchy entities fetched may then be processed at step 234 where the netlist for the new current level (associated with the entity) is extracted as described above. Synthesis and technology mapping follow as described above. Note that at any given time, the compiler can have a processor or group of processors working on some or all hierarchy entities on the list. As more items are added to the list—because of further expansion of the hierarchy tree, the compiler can allocate more processors to the problem. When a given hierarchy entity is fully processed, the system can review a list of free processors and deploy one or more listed processors to execute tasks on the list of unprocessed hierarchy entities.

Ultimately, the compiler will consider each level of the design hierarchy. At that point, decision step 242 is answered in the affirmative and process control is directed to a step 246 where the mapped pieces of the electronic design are stitched together and fed to the compiler database. This is illustrated at a process step 246. In order to cleanly mesh the boundaries between the various pieces of the design that have been compiled in virtual isolation, various boundary optimization techniques may be employed before actually stitching together the electronic design. For technology mapping, for example, the compiler can consider all cells on a boundary. If it finds a cell on one side of the boundary that feeds a cell on the other side of the boundary and the cells can be combined, the compiler combines the cells. For example, a logic element which implements a two input AND gate feeding another logic element which implements a three input AND gate can be combined into a single four input AND gate; LE_AND3(in1, in2, LE_AND2(in3, in4))=AND4(in1, in2, in3, in4) For packing cells into logic array blocks, for example, the compiler may examine every cell on the border and determine whether it would be more efficient to pack the cell into the logic array block immediately across the border.

After the current design has been fed to the database, a partitioner in the compiler partitions the multiple parts of the design as described with respect to step 210 of FIG. 2A. Thereafter, compilation proceeds to completion through steps 212, 214, 216, and 218 as described above with reference to FIG. 2A. Note that arbitrary loop backs may be performed as described above with reference to FIG. 2A.

Also, although FIG. 2B shows the point at which the hierarchy levels are merged together (step 246) to come after creating virtual cell groups (step 240), it could logically come later (after partitioning into multiple layers) or earlier such as after logic synthesis but before technology mapping. Any point along the compilation continuum is a logical place for it to happen.

In addition to lending itself nicely to parallel processing, a hierarchical flow such as flow 230 has the benefit of giving an end design which is similar in structure to the user's original design, and thus is much easier for the customer to understand. It also may be faster to work on because the compiler receives smaller problems, each of which is more than proportionally faster to work on (assuming that the time to execute a problem's heuristic does not scale linearly with size). For example, given a heuristic in which the compile time increases with the square of the problem's size, by splitting the problem in half, each half will run in one-fourth the total time of the original.

As alluded to above, a goal of parallel processing is to use multiple CPUs to work on different aspects of a compilation project simultaneously and thus reduce the total amount of time it takes to compile the entire project. An easy way to achieve this is to split the problem into disjoint problems which can be solved independently. Various classes of such disjoint problems will be described below.

One class of severable compilation projects includes those projects that contain multiple full compilation tasks. In such projects, multiple full compilations must be performed. Each of these full compilations is viewed as a separate task (i.e., a disjoint problem). Thus, each of the full compilation tasks may be executed in parallel and employ one or more CPUs. Each of these full compilation tasks involves compiling a single design from start to finish as with a non-hierarchical compile flow as shown in FIG. 2A or with a hierarchical compile flow as shown in FIG. 2B.

Another class of divisible compilation projects includes those projects in which the logical hierarchy of an electronic design provides the boundaries between isolated compilation tasks. These divisions usually lend themselves most conveniently to hierarchical compilation flows such as the flow shown in FIG. 2B. An example includes netlist extractions in which the children of a root entity are compiled in isolation by separate processing resources.

Yet another class of divisible compilation projects are projects in which the tasks are based upon an architecture of the target hardware device. Parallel processing of such compilation projects may be equally well suited for non-hierarchical and hierarchical compilation flows. Generally, though not necessarily, the divisible compilation tasks involve partitioning, fitting, or other procedures specifically adapted to the target hardware device. Often, the boundaries between the various compilation tasks are based upon some architectural structure of the hardware design (e.g., a logic array block or row of a PLD).

COMPILE PROJECTS CONTAINING MULTIPLE FULL COMPILE TASKS

Some compile projects include multiple full compilations as tasks. For example, a user may specify various designs each being slightly modified from the previous. The compilation results of these designs are to be compared to determine which modification best serves the user's needs. Also, a single design may be fully compiled in multiple manners, each with a different compiler setting. Again the results of these full compilations can be compared.

Regarding multiple design variations, a user frequently wants to compare related but distinct designs for achieving different goals, such as increasing device speed or fitting circuitry on a given chip or floor-plan. Such different objectives could be supported by different assignments made globally or specifically within a base design. For designers seeking to compare the results of such different designs, such as for example designs having different assignments, the current generation of design tools require that several designs be created (e.g., each having differing assignments), stored, and compiled separately. This duplication of effort tends to be tedious, time consuming and can place a strain on computational resources. The creation, storage. and execution of such related electronic designs is facilitated by the processes described in U.S. patent application Ser. No. 08/958,626, naming Heile et al. as inventors, filed on the same day as this application, and entitled "INTERFACE FOR COMPILING DESIGN VARIATIONS IN ELECTRONIC DESIGN ENVIRONMENTS." That document is incorporated herein by reference for all purposes.

In accordance with this invention, each of the individual design variations can be compiled as a separate process (compile task). In some cases, one or more of these compile tasks can be independently split into sub processes, each of which can in turn be split into sub-sub processes, etc. Each compile task (process) runs on one or more CPUs, and as the number of sub-processes changes for each parent process, so can its allocation of the total pool of CPUs. Thus, the various designs can be compiled simultaneously, greatly speeding completion of the compilation project.

Figure 3A:
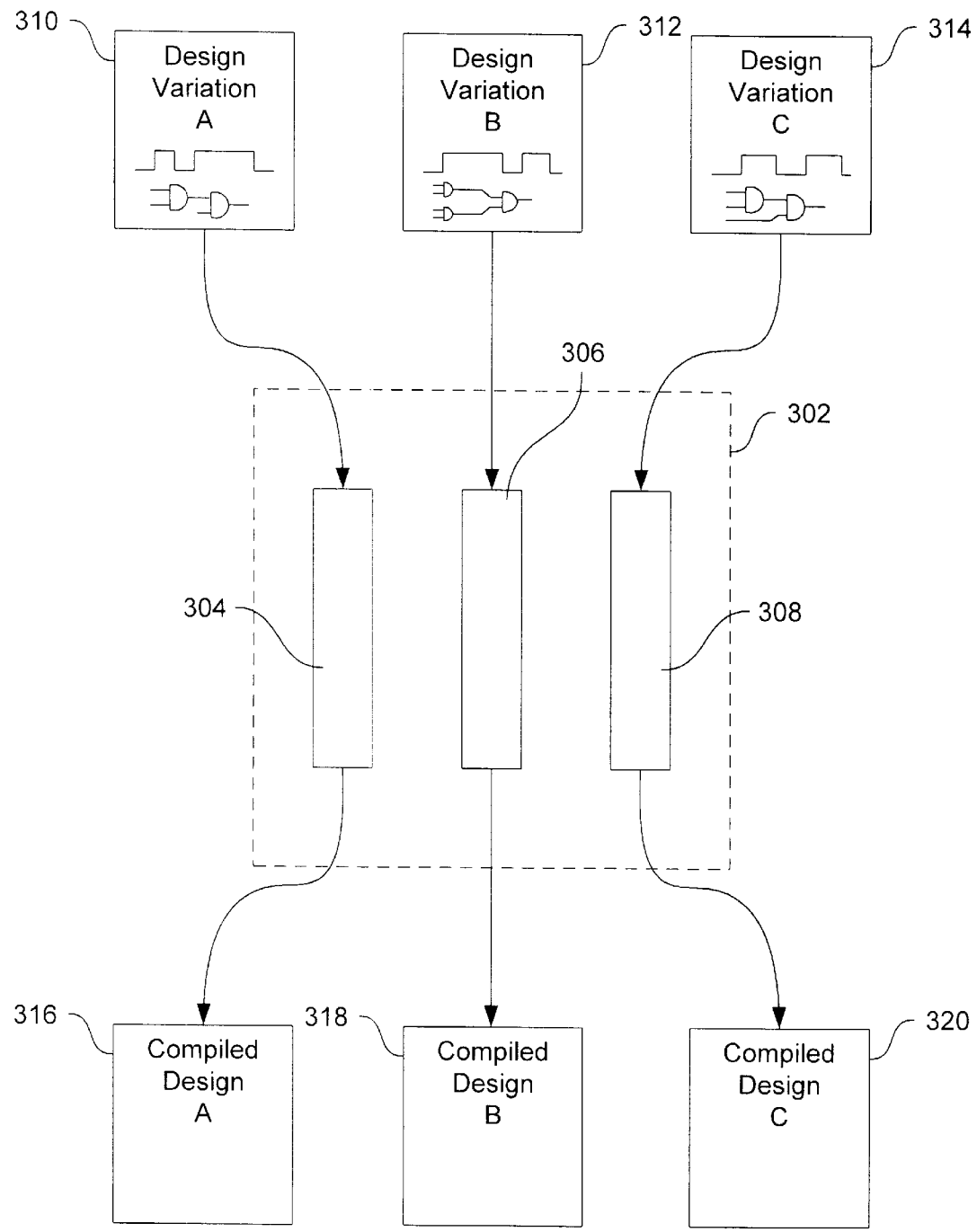
FIG. 3A is a block diagram depicting a compiler arrangement in which multiple variations on an electronic design are fully compiled in parallel.

FIG. 3A depicts a compiler arrangement in which multiple design variations are processed in parallel. In FIG. 3A, a compiler 302 controls the operation of a first processing resource 304, a second processing resource 306, and a third processing resource 308. As explained with reference to FIG. 1, these processing resources may be networked CPUs reconfigurable computing resources, etc. Further, each of the computing resource blocks may contain one or more CPUs or other processing entities. As indicated, a designer or an electronic design tool has generated multiple variations on a single design as described above. In this Figure, these designs are depicted as a design variation A 310, a design variation B 312, and a design variation C 314. These three design variations may be fully compiled in parallel under the control of compiler 302. As shown, design variation A is compiled by utilizing processing resources 304. Design variation B is fully compiled, independently of design variation A, utilizing processing resources 306. Finally, design variation C is fully compiled, independently of design variations A and B, utilizing processing resources 308. Compiler 302 outputs a compiled design A 315, a compiled design B 318 and a compile design C 320 as shown. Note that compiled designs A, B, and C correspond to design variations A, B, and C respectively. By operating processing resources 304, 306, and 308 in parallel, compile designs A, B and C are output much more rapidly then would be possible without out a parallel processing environment.

It is also possible to fully compile a single design multiple times, each with a different compiler setting. Each of the multiple different full compilations of the electronic design serves as a separate compilation task. Examples of different compiler settings include alternative settings for the heuristics controlling logic minimization (synthesis) and alternative settings for the heuristics controlling technology mapping algorithms. In synthesis, for example, a designer can take a region of logic and synthesize it with two or more different sequence of heuristics and then choose the best performing result.

One widely known package of logic minimization algorithms is the "Berkeley SIS" available from the University of California at Berkeley, Calif. The Berkeley SIS is also available via the World Wide Web at the address ftp:/ic.eecs.berkeley.edu/pub/Sis. In this package, a user may control the order in which the various logic minimization techniques are called. In a given compilation project, the user may specify multiple orderings of the minimization techniques, each corresponding to a full compilation task. The user may also control parameters used by the techniques to control how aggressive the techniques are applied to minimize the logic. More aggressive settings tend to revise the user's design to a greater extent. One technique in the Berkeley SIS package is known as "Eliminate." It will increase the size of a design in a manner that makes it easy for other techniques, executed at a later time, to greatly reduce the size. Often a user will not know, a priori, which parameter setting for Eliminate will work best for all or part of his or her design. Thus, the user could benefit by compiling his or her design under multiple parameter settings of the Eliminate technique. The present invention allows these multiple compilations to be performed in parallel.

Regarding alternative heuristics for technology mapping, there are different ways to decompose logic, and each will give a different technology mapping. For example, one decomposition may provide a logic block in a long slender schematic, while a second decomposition of the same logic block will provide a more even triangular schematic. These two different decompositions may be specified by different synthesis settings. In this invention, the design could be compiled for each such decomposition to determine which does the best job of mapping. Often it will turn out that one of the decompositions is found to require fewer logic elements during technology mapping. For each decomposition, the associated technology mapping compilation step can be executed in parallel with the technology mappings for the other decompositions.

It should be understood that for any heuristic option listed, the compiler could for each cone of logic (group of logic nodes feeding a single register) synthesize that cone in several manners and then choose the best result. The heuristic setting does not have to be a global option on the entire design.

The concept of trying multiple compilation heuristics and then choosing the best compilation result can be applied to still other areas of compilation such as state machine processing, netlist extraction, and partitioning. For state machine processing, consider the following example. The logic associated with a state machine depends upon the encoding used to call the states. A state machine having twelve states, for example, may encode state 0 with 0000, state 1 with 0001, state 2 with 1111, . . . . These encoded values may be provided in two or more registers, with the first register storing the first two bits of the encoded state and the second register storing the second two bits of the encoded state. The amount of required logic can vary significantly depending upon the encoding of the various states. If the encoding is chosen so that only a limited number of transitions are required for each state change, the required amount of logic is reduced.

Similarly, multiple partitioning heuristics are available. In accordance with this aspect of the invention, the compiler could run several well-known partitioning heuristics and determine which one gives the best result.

Still another area where different compiler setting can be employed to run a single electronic design in multiple ways is in the context of finding the best fit for the electronic design. The design can be compiled in various manners, with the goal of identifying the compilation conditions that give the best fit for the electronic design. The various fitting conditions can be employed in multiple full compilations which are provided as separate compilation tasks running in parallel. At the end of the parallel execution of these compilations, the results are compared to determine the relative fit provided by the different compilation conditions.

Figure 3B:
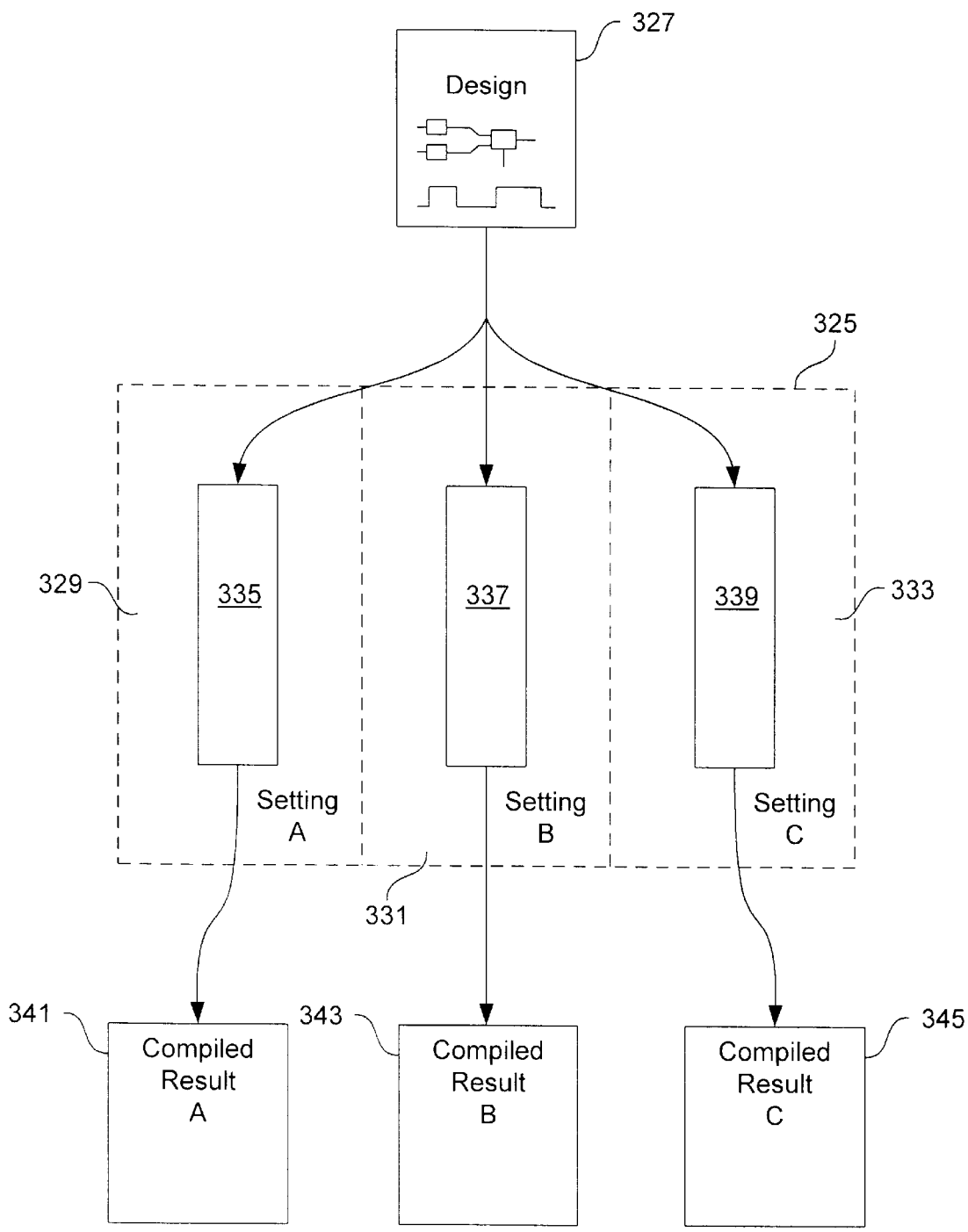
FIG. 3B is a block diagram depicting a compiler arrangement in which a single design is fully compiled multiple times in parallel, with each full compilation of the design being performed under a different compiler setting.

FIG. 3B depicts a compiler arrangement whereby a compiler 325 fully compiles a single design (design 327) in multiple different manners. Each of these manners corresponds to a different setting of the compiler 325. Specifically, compiler 325 is shown having a setting A 329, a setting B 331, and a setting C 333. These settings may correspond to different heuristics for synthesis, technology mapping, fitting, etc., as explained above. Compiler 325 allocates a separate processing resource for each of the settings. In the examples shown, setting A is given a processing resource 335, setting B is given a processing resource 337, and setting C is given a processing resource 339. Again, each of these processing resources may be one or more CPUs, reconfigurable computing resources, etc. As they are operated in parallel, the full compilations of design 327 according to the various settings are performed expeditiously. The parallel output from compiler 325 is a compiled result A 341 corresponding to setting A, a compiled result B 343 corresponding to setting B, and a compiled result C 345 corresponding to setting C.

Generically, in the scenario illustrated in FIG. 3B, the compiler tries more than one heuristic and then chooses one. In accordance with this invention, there are two valid approaches to this. If the goal is to minimize run-time, then the compiler should run each heuristic in parallel and as soon as any heuristic finishes with an acceptable solution, it should accept that result and stop the other heuristics from processing.

If, on the other hand, the goal is consistent results so that no matter what target hardware device is employed the same results occur, then the design software should run all heuristics to completion and employ a consistent technique for choosing among the results. The one exception to this rule is when a heuristic is evaluated based upon a pass/fail basis rather than a quality of result basis. This is the case, for example, when a partitioning heuristic uses more than the legal number of lines. In that case, it is necessary that the heuristics have a well defined order, and provided that heuristics 1 thorough k−1 have completed and failed, then it is acceptable to take the answer from heuristic k, without looking at the results of heuristics k+1 through n (the last possible heuristic).

TASKS BASED ON THE LOGICAL
HIERARCHY OF AN ELECTRONIC DESIGN

Typically, an electronic design contains one or more hierarchies of design entities and each design hierarchy tree has a root entity, which is the topmost design entity in that hierarchy tree (the top-level functional block). Other design entities in the design hierarchy tree are called child entities. As explained in more detail below, individual levels of the hierarchy may serve as separate compilation tasks within a full compilation project. That is, compilation of a hierarchical electronic design (the compilation project) can be divided into subcompilations of various levels in the hierarchy (compilation tasks) which are performed in isolation and with distinct processors.

Figure 4A:
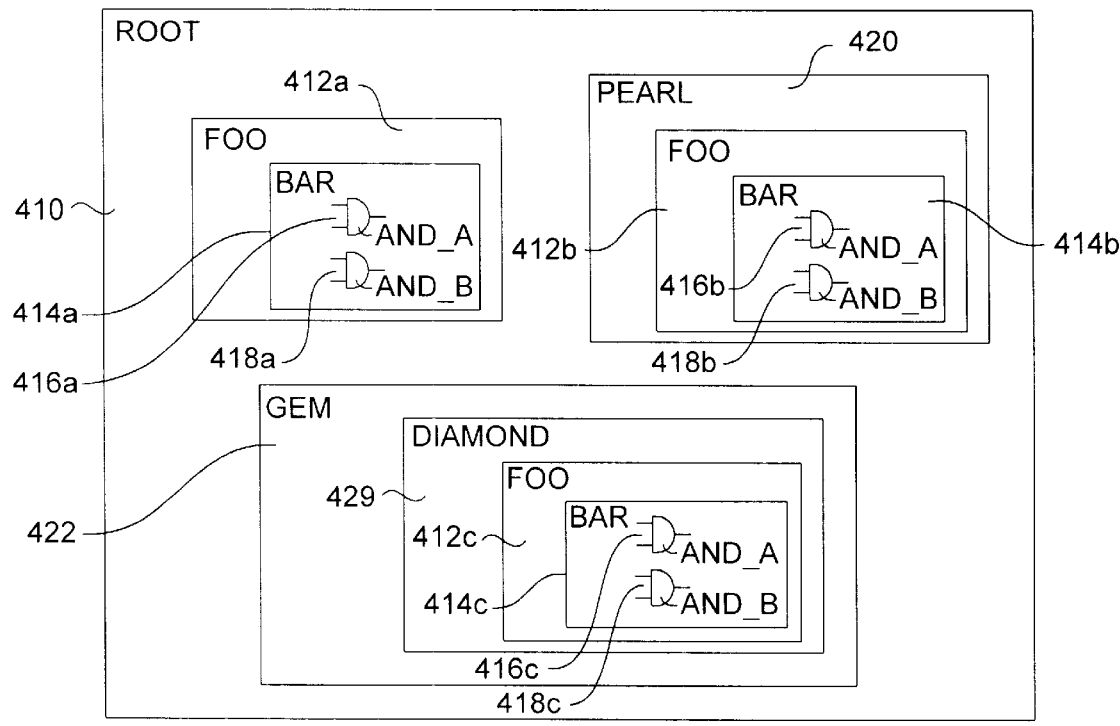
FIG. 4A is a block diagram illustrating a typical integrated circuit having a top level circuit and a plurality of lower level circuits therein.

The concept of a design hierarchy will now be further explained. FIG. 4A is a block diagram illustrating an integrated circuit having a ROOT circuit 410 and a plurality of lower level (children) circuits therein. As shown, within ROOT circuit 410 there is a FOO circuit 412a (e.g., an arbitrary logic block) that further includes a BAR circuit 414a having a first logic gate AND_A 416a and a second logic gate AND_B 418a therein. FOO circuit 412a generically represents any type of circuit, including other circuits and/or components. As such, the inclusion of logic AND gates (416a and 418a) within BAR circuit 414a is only one example of the types of circuits within either the BAR, FOO and/or ROOT circuits.

Also shown within ROOT circuit 410 there is a PEARL circuit 420 (e.g., an arithmetic logic unit) that includes a similarly arranged FOO circuit 412b with a BAR circuit 414b having a first logic gate AND_A 416b and a second logic gate AND_B 418b therein. Finally, as shown in FIG. 4A there is also a GEM circuit 422 that includes a DIAMOND circuit 424. Within DIAMOND circuit 424 there is another FOO circuit 412c that includes another BAR circuit 414c having first and second logic gates, AND_A 416c, and AND_B 418c, respectively, therein.

Figure 4B:
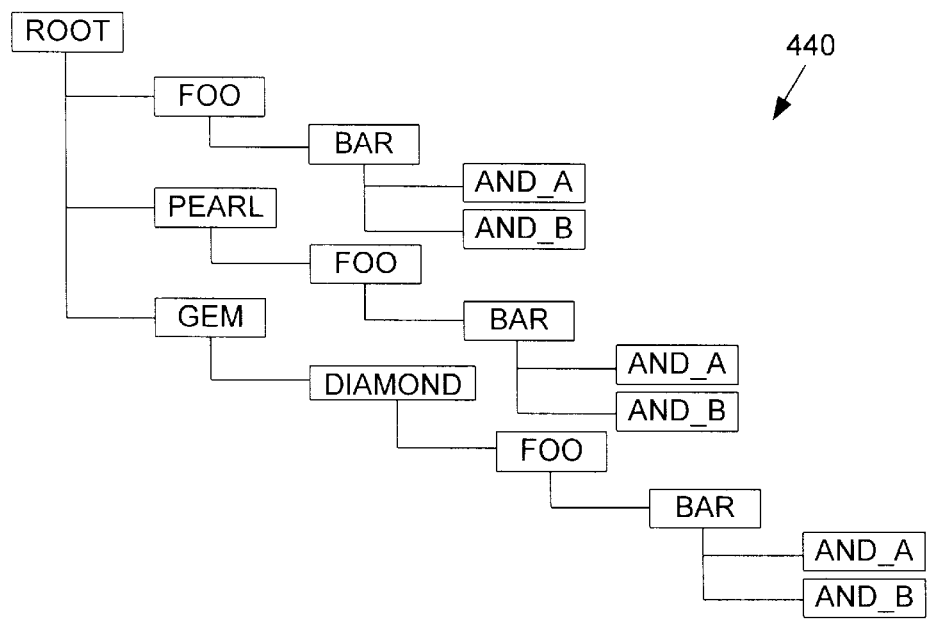
FIG. 4B is a hierarchical structure associated with the integrated circuit in FIG. 4A.

The hierarchical structure of the integrated circuit in FIG. 4A is illustrated in a hierarchical diagram 440 in FIG. 4B. As shown, at the top of the hierarchy is ROOT circuit 410. The next level of circuits includes FOO circuit 414a, PEARL circuit 420 and GEM circuit 422. Immediately below FOO circuit 414a is BAR circuit 414a.

The various entities in the hierarchy can be reached independently by tracing (recursing) from the root and down the appropriate branch. The recursions to multiple separate entities can take place in parallel. This can be accomplished, for example, by following independent paths leading from the highest level to two or more entities. For example, to reach AND_A 416a during netlist extraction, the path would be ROOT/FOO/BAR/AND_A. Concurrently, the compiler can recurse down the path to AND_B 418b in PEARL circuit 420 via ROOT/PEARL/FOO/BAR/AND_B. The last illustrated branch of hierarchical diagram 440 includes GEM circuit 422 and DIAMOND circuit 424, followed by another instance of a FOO/BAR circuit arrangement that leads ultimately to AND_A 416c and AND_A 418c. As with the other branches in the hierarchy, the compiler can process entities within GEM 422 in parallel with other entities. Even within GEM 422, for example, the compiler can process AND_A 416c and AND_B 419c in parallel, if necessitated by processing constraints.

In the hierarchical compilation flow shown in FIG. 2B, the compiler processes the levels of a logical hierarchical design from the top down. At each level, it identifies the children entities of that level and any assignments thereon transferred from the parent or parents. This top-down hierarchical approach allows different branches of the electronic design to be processed independently and in parallel. As each new child or grandchild entity is identified, the compiler can allocate additional processing resources as necessary to expeditiously process the entire design.

Examples of independent compilation steps that can be performed in parallel on separate design entities include netlist extraction (step 234), logic synthesis (step 236), technology mapping (step 238) (including creating virtual groups of cells (step 240)), and stitching entities together to build a database (step 246). As noted above, when the separately processed entities are stitched together at step 246, simple boundary optimization techniques may be employed to reduce discontinuities at the boundaries.

As an example, consider FIGS. 4A and 4B. The compiler must first extract the root level entity 410 before it can identify its children FOO 412A, PEARL 420, and GEM 422. In a concrete example, the root level entity may be a CPU and its children may be an arithmetic logic unit, an instruction decoder, and an interrupt controller.

After root entity 410 is extracted and its children have been identified, the compiler may allocate separate processing resources for each of the three children identified. These processing resources may then execute the instructions for extracting a netlist for each of the children independently and in parallel. The processing resources may then independently synthesize the netlists for each of the children entities, map them, and create virtual cell groups as appropriate.

During the extraction process on each of the children, children entities of these children may be identified in turn. For example, during extraction of FOO entity 412A, the compiler will discover BAR child entity 414A. If it appears that the processing resource that is currently compiling FOO entity 412A is at capacity, the compiler may allocate additional processing resources to extract and otherwise compile BAR entity 414A. This will more often be the case when a given child entity has many complex children of its own. While the compiler is compiling FOO 412A, it may concurrently process PEARL 420, and GEM 422 in a similar manner.

After all entities have been extracted, etc. separately, they must be flattened, stitched together, and placed in the database. This takes place from the bottom of the hierarchy up to the top. The various nodes at a level are extracted independently and in parallel and added to the flat database file independently and in parallel.

TASKS BASED ON THE ARCHITECTURE OF A HARDWARE DEVICE

Figure 5:
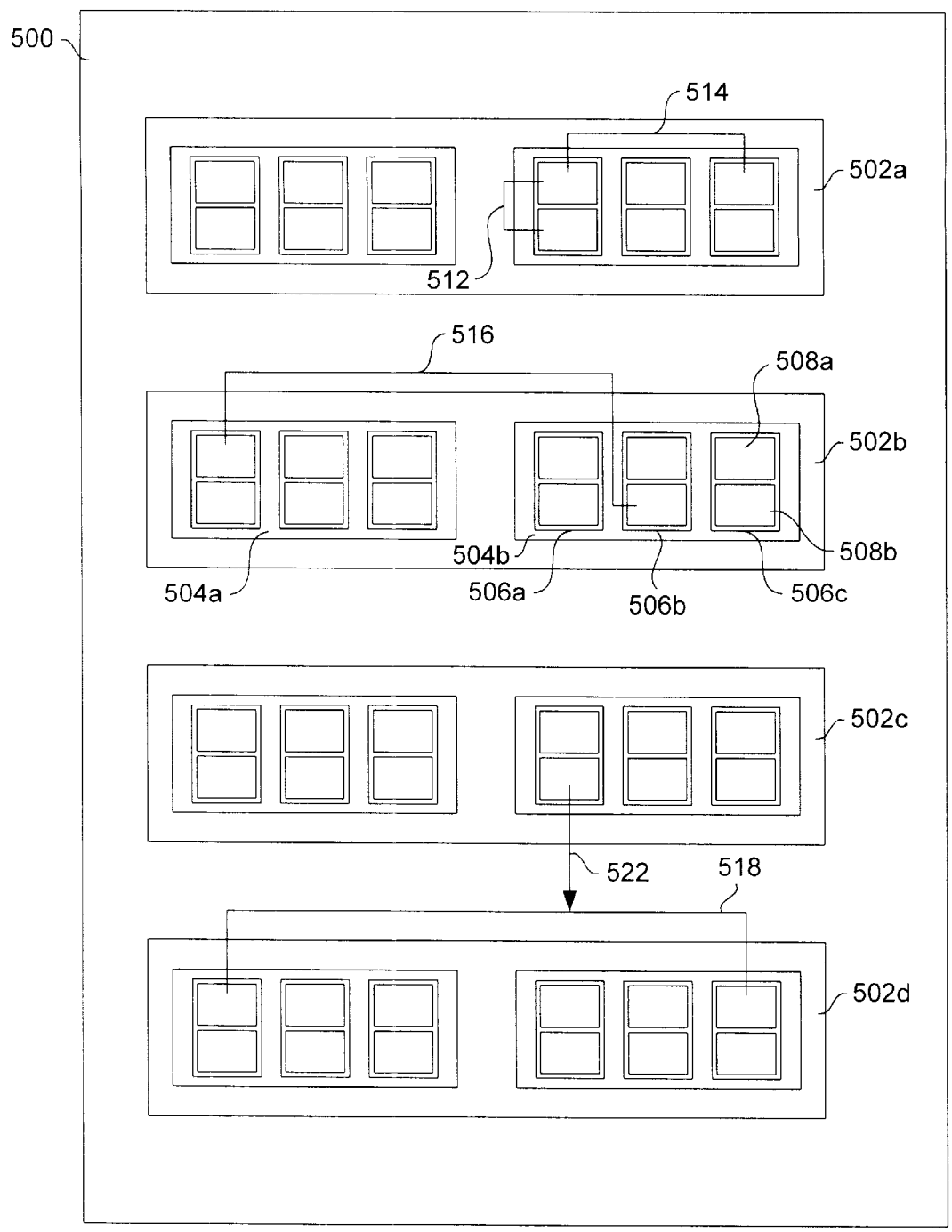
FIG. 5 is an idealized block representation of the architecture of an arbitrary hardware device, including interconnects.

Some compilation tasks of this invention are based upon fitting a design to individual architectural elements of the target hardware device. This aspect of the invention may be better understood with reference to, inter alia, a hypothetical target hardware device having multiple hierarchical levels. Such a hardware device is represented in FIG. 5. This idealized representation roughly conforms to the layout of a FLEX 10K programmable logic device available from Altera Corporation of San Jose, Calif. In FIG. 5, a programmable logic device 500 is segmented into a plurality of "rows" to facilitate interconnection between logic elements on a given row. In the hypothetical example shown, there are four rows: 502a, 502b, 502c, and 502d.

Each row of programmable logic device 500 is further subdivided into two "half-rows." For example, row 502b is shown to contain a half-row 504a and a half-row 504b. The next lower level of the hierarchy is the "logic array block" (LAB). Half-row 504b, for example, contains three LABs: an LAB 506a, an LAB 506b, and an LAB 506c. Finally, at the base of the of the hierarchy are several "logic elements." Each such logic element exists within a single logic array block. For example, LAB 506c includes two logic elements: a logic element 508a and a logic element 508b.

In short, PLD 500 includes four levels of hierarchy: (1) rows, (2) half-rows, (3) LABs, and (4) logic elements. Any logic element within PLD 500 can be uniquely specified (and located) by specifying a value for each of these four levels of the containment hierarchy. For example, logic element 508b can be specified as follows: row (2), half-row (2), LAB (3), LE (2).

To fit a logic design onto a target hardware device such as that shown in FIG. 5, a synthesized netlist is divided into logic cells which are placed in the various logic elements as uniquely defined above. Thus, each logic cell from the synthesized netlist resides in a unique single logic element.

Often, a multi-level hierarchical structure such as that shown in PLD 500 includes multiple levels of routing lines (interconnects). These connect the uniquely placed logic cells to complete circuits. In PLD 500, for example, four levels of interconnect are provided, one for each of the four hierarchy levels. First a local interconnect such as interconnect 512 is employed to connect two logic elements within the same LAB. At the next level, a LAB-to-LAB interconnect such as interconnect 514 is employed to connect two LABs within the same half-row. At the next higher level, a "global horizontal" interconnect is employed to connect logic elements lying in the same row but in different half-rows. An example of a global horizontal interconnect is interconnect 516 shown in row 502b. Another global horizontal interconnect is shown as interconnect 518, linking logic elements within row 502d. Finally, a "global vertical" interconnect is employed to link a logic element in one row with a logic element in a different row. For example, a global vertical interconnect 522 connects a logic element in the first LAB of the second half-row of row 502c to two separate logic elements in row 502d. In the embodiment shown, this is accomplished by providing global vertical interconnect 522 between the above-described logic element in row 502c to global horizontal interconnect 518 in row 502d. Consistent with the architecture of Altera Corporation's FLEX 10K CPLD, global vertical interconnects are directly coupled to the logic element transmitting a signal and indirectly coupled (through a global horizontal interconnect) to the logic elements receiving the transmitted signal.

In a target hardware device, there will be many paths available for routing a given signal line. During the routing stage, these various possible routing paths must be evaluated to determine which is best for the design being fit.

The interconnect structure and overall architecture of the Altera FLEX 10K family of PLDs is described in much greater detail in U.S. Pat. No. 5,550,782, issued on Aug. 27, 1996, naming Cliff et al. as inventors, and entitled "PROGRAMMABLE LOGIC ARRAY INTEGRATED CIRCUITS." That application is incorporated herein by reference for all purposes. Additional discussion of the FLEX 10K and other PLD products may be found in the Altera 1996 Data Book, available from Altera Corporation of San Jose, Calif. The Data Book is incorporated herein by reference for all purposes.

Briefly, in the FLEX 10K architecture, there are at least three rows, with two half-rows per row, and twelve LABs per half-row. Each LAB includes eight logic elements each of which, in turn, includes a 4-input look-up table, a programmable flip-flop, and dedicated signal paths for carry and cascade functions. The eight logic elements in an LAB can be used to create medium-sized blocks of logic—such as 8-bit counters, address decoders, or state machines—or combined across LABs to create larger logic blocks.

It should be understood that the present invention is not limited to the Altera FLEX 10K architecture or any other hardware architecture for that matter. In fact, it is not even limited to programmable logic devices. It may be employed generically in target hardware devices as broadly defined above and preferably in application specific integrated circuit designs. PLDs are just one example of ASICs that can benefit from application of the present invention.

As indicated above, a compiler may partition a design between multiple chips or portions of a chip (step 210 of processes 202 and 230). In accordance with this invention, a single partitioning procedure is divided into multiple compilation tasks which are executed in parallel. Alternatively, various partitioning algorithms may be performed in parallel to find the best partition of a given design.

A common goal in partitioning is to partition a design to minimize the number of input/output pins on the devices. When partitioning is applied to intradevice structures such as rows or LABs, the goal is to reduce the amount of interstructure interconnects (e.g., global interconnects between rows). In a typical compilation scenario, the individual rows, LABs, logic elements, etc. are initially populated with logic in some arbitrary manner. Then the compiler applies a partitioning algorithm to reduce the amount of input/output pins and/or non-local interconnects. In this invention, the partitioning algorithm is divided into pieces which can be executed in parallel.

One class of partitioning algorithm that is particularly susceptible to division into separate compilation tasks is the bipartitioning algorithms. In these algorithms, logic cells are initially placed in multiple bins (chips, rows, LABs, etc.). Then two bins are selected and some of the logic cells in those bins are swapped so that the number of signal crossings between the selected bins can be compared before and after the swap. Then two other bins are selected and their logic cells swapped. This continues until every binary combination is selected and their logic cells swapped. The ultimate goal is to minimize the sum of the signal crossings between bins.

Referring to FIG. 5, LABs 506a and 506b could be chosen initially and their logic cells swapped according to a standard algorithm. In addition, LABs 506a and 506c could be subsequently selected and their cells swapped. Finally, LABs 506b and 506c could have their cells swapped. In the end, the swapping algorithms—applied in this bipartite manner—should reduce the number of signal crossings between the individual LABs. The same approach could be applied to logic cells in different rows. For example, the logic cells in rows 502a–502b, 502a–502c, 502a–502d, 502b–502c, 502b–502d, and 502c–502d could be subject to similar swapping algorithms, with the end goal being a reduction in interrow signal crossings.

Swapping heuristics are known in the art and described in the following references: U.S. Pat. No. 3,617,714, issued to Kenighan et al. on Nov. 2, 1971, and entitled "METHOD OF MINIMIZING THE INTERCONNECTION COST OF LINKED OBJECTS" and U.S. Pat. No. 5,341,308 issued to Mendel on Aug. 23, 1994, and entitled "METHODS FOR ALLOCATING CIRCUIT ELEMENTS BETWEEN CIRCUIT GROUPS." Each of these references is incorporated herein by reference for all purposes.

If the target hardware device (or devices) includes multiple bins (e.g., five rows), then at least some of the bin pair swaps can be performed in isolation. For example swapping between rows 1 and 3 can be performed in isolation from swapping between rows 4 and 5. In accordance with this invention, such bin pair swaps are identified and then executed independently with different processing resources.

After partitioning is completed, a fitter is called to place the logic cells at fixed locations (logic elements) in their design partitions (bins). See step 212 of FIG. 2A. In accordance with this invention, multiple fitters may called concurrently in order handle the fitting of each isolated bin. Obviously, separate processing resources may be deployed for each filter/partition combination. Most easily, individual chips of a partition can be fit separately and in parallel. In addition, parallel fitting can be applied to individual rows, half-rows, LABs, etc. For example, with reference to FIG. 5, fitting can be performed concurrently on rows 502a and 502c.

While the above discussion has focused on parallel processing to optimize the fitting of logic on target devices having hierarchical architectures, there is in principle no reason why many of the techniques described herein can not also be applied to target devices having a non-hierarchical ("flat") architecture. Such devices are improved by Xilinx Corporation of San Jose, Calif., for example. Many fitting algorithms treat the placement problem for a flat architecture as a recursive problem of dividing the chip into regions—such as quadrants, regions based on the user's input hierarchy, or regions based on the user's floorplanning—and then minimizing the number of connections that cross these artificial region boundaries. This is done recursively to put logic that is tightly coupled into the same half, quarter, eighth, etc. These regions need not be defined by halves but could be defined by thirds for example, and they could be non-equal size regions, particularly at a manual or automatic floor-planning stage which splits the chip into different regions, one region per section of the design (a section typically, but not always corresponds to a hierarchy level of the design). In any of these cases, the chip is from the algorithm's viewpoint split into independent regions and thus each region can be worked on independently (and processed in parallel).

The above discussion has also focused on the placement stage of fitting. Similar techniques can be employed for routing as well. On a hierarchical chip such as one of the CPLDs available from Altera Corporation, one routing method involves first routing "global" signals which need to span the entire chip, and then routing the remaining signals which have a fan-out limited to a lower level of the hierarchy. So, for example, once the routing for those signals that need to cross row boundaries is done, the routing for each row could be done in parallel.

For a grid type chip (of the type available from Xilinx Corporation), once all signals that cross arbitrary boundaries of the chip are routed, each section of the chip delineated by these arbitrary boundaries could be routed in parallel. Optimal locations for these boundaries can be determined empirically. For purposes of this invention, they may or may not be the same as the boundaries defined during placement of logic cells. In one approach, the compiler initially divides the grid style chip into quarters and then routes all signals that need to cross from one quadrant to another. Once this level of routing is complete, the remaining problem may be divided into four parallel problems. For each of those parallel problems, the compiler could repeat the quartering eventually ending up with sixteen parallel problems, etc.

TASKS BASED ON ISOLATED REGIONS OF A COMPILATION PROJECT

Sometimes an electronic design contains natural boundaries which may be used to define separate compilation tasks for parallel processing. These boundaries define independent regions of logic isolated from one another for purposes of compilation. Examples of independent regions include pipelined logic and state machines. In pipelined logic, one logical region generally feeds another logical region and so on. Each of the regions may be separated by registers, which form natural boundaries for parallel processing. Pipelined architecture is common in microprocessors and other designs (even simple designs like a multiplexer) where each stage of the pipeline requires one or more cycles to complete. Examples of pipeline stages which can be processed in parallel include fetching an instruction, decoding the instruction, execution of Boolean arithmetic operations, execution of floating point operations, insertion of values into the appropriate register files, etc.

In the case of a state machine, the logic employed to run the state machine may be isolated from the output of the state machine. Thus, a state machine may define a boundary of two independent regions that can be processed in parallel. This can be understood by recognizing that a state machine is typically implemented as inputs feeding logic and registers which make up the state machine. The registers and logic then feed the output of the state machine. The registers that make up the state machine will separate the logic on the input and output halves of the state machine. In view of this, the state machine example can often be characterized as a subset of the register boundary case.

Another example of a natural boundary providing independent regions that can be compiled in parallel is a boundary between two isolated regions identified for incremental recompile. As mentioned, incremental compile requires identification of a design change's "sphere of influence" which is then compiled independently and inserted at the proper location of the compiled version of an original (unchanged) design. The sphere of influence is defined in terms of affected gates and nets in a netlist. A user or design tool may change more than one region of a design. In this case, the compiler may identify multiple sphere's of influence. Any two of these that do not overlap may be synthesized in parallel in accordance with this invention.

While most synthesis steps can be performed independently in isolated regions defined as above, there are some synthesis techniques (directed to registers) that might have been conducted on a single processing resource after the other synthesis steps have been processed in parallel. These include duplicate register extraction and removal of registers that synthesize to ground. Duplicate register extraction is a process in which two registers having the identical logic feeding them are combined into one register. Because the registers often define boundaries in this embodiment, duplicate register extraction may be more safely conducted after the other synthesis techniques are completed. In the case of synthesizing a register to ground, some synthesis techniques allow registers to converted to a simple ground signal and propagated forward. This technique is performed when a register is powered up to ground and the logic that feeds the register is also ground so that the register is never going to output anything but ground. Again because this technique changes a register which might be a boundary, the technique should be saved until after the other synthesis techniques have operated on the independent logic regions.

While the above scenario reserves synthesis of registers as a post parallel synthesis problem, in another embodiment, all synthesis techniques (including those operating on registers) can be performed in parallel. In such embodiment, parallel synthesis is performed on the individual logic regions. When the compiler discovers that a synthesis operation is about to be performed on a register that also defines a boundary, it loops back and resets the boundary to not include the discovered register. Parallel synthesis then proceeds again based upon the new boundaries.

Figure 6A:
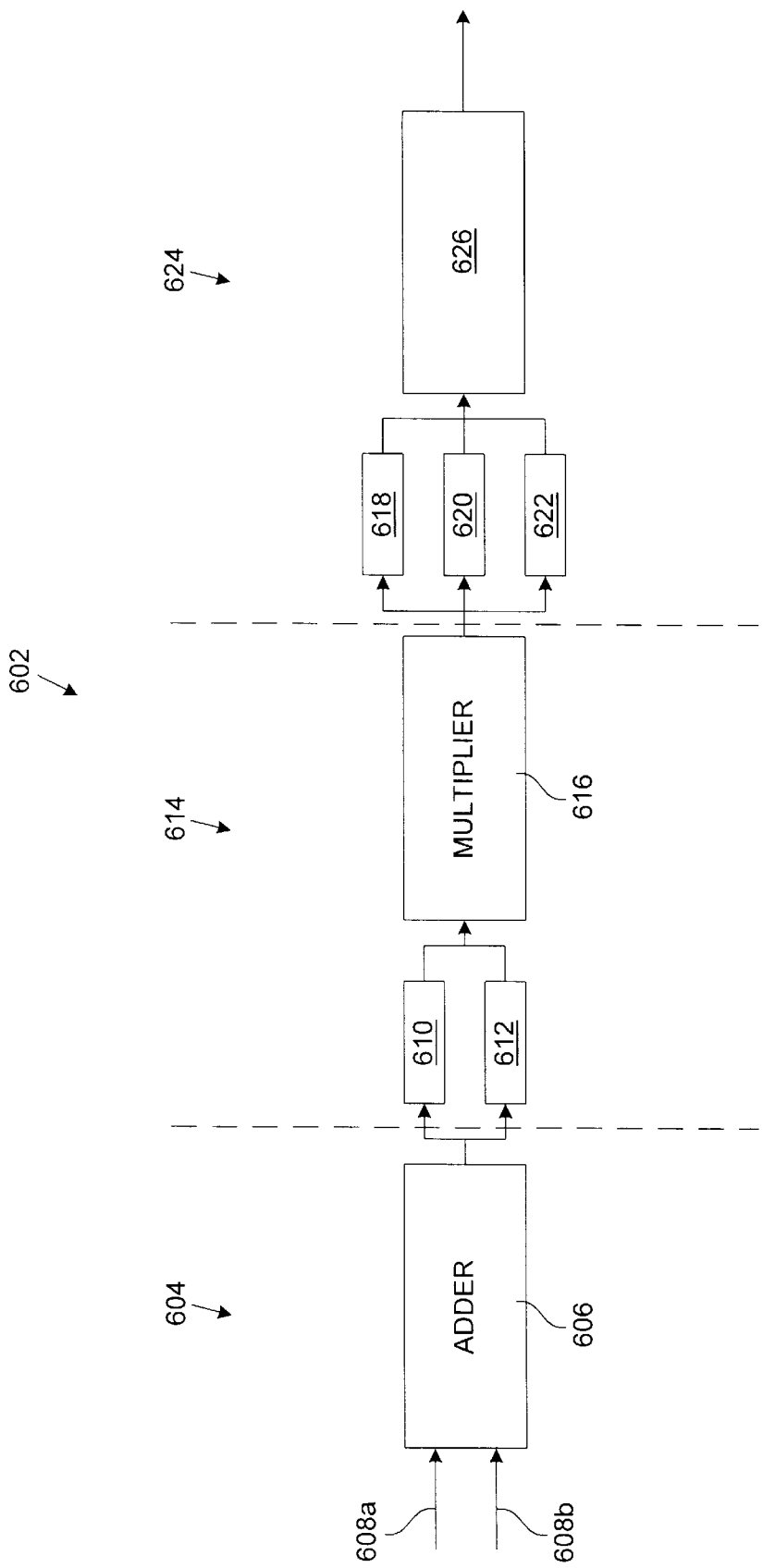
FIG. 6A is a block diagram illustrating logic including an isolated adder and an isolated multiplier which can be compiled in parallel.

FIG. 6A is a block diagram of a portion of an electronic design 602 having three logic regions isolated from one another by registers. A first combinatorial logic region 604 includes an adder 606 fed by inputs 608a and 608b. Adder 606 feeds a set of registers including registers 610 and 612 according to a defined rules. A second combinatorial logic region 614 reads registers 610 and 612 and deploys a multiplier 616 to multiply the results according to defined rules. The products obtained by multiplier 616 are stored in registers 618, 620, and 622. Next a third combinatorial logic region 624 includes logic 626 which reads the results stored in registers 618, 620, and 622 and outputs a 1 if there are more 1s in the answer and outputs a 0 if there are more 0s in the answer. Combinatorial groups 604, 614, and 624 can be synthesized in parallel because there are registers separating them from one another.

Figure 6B:
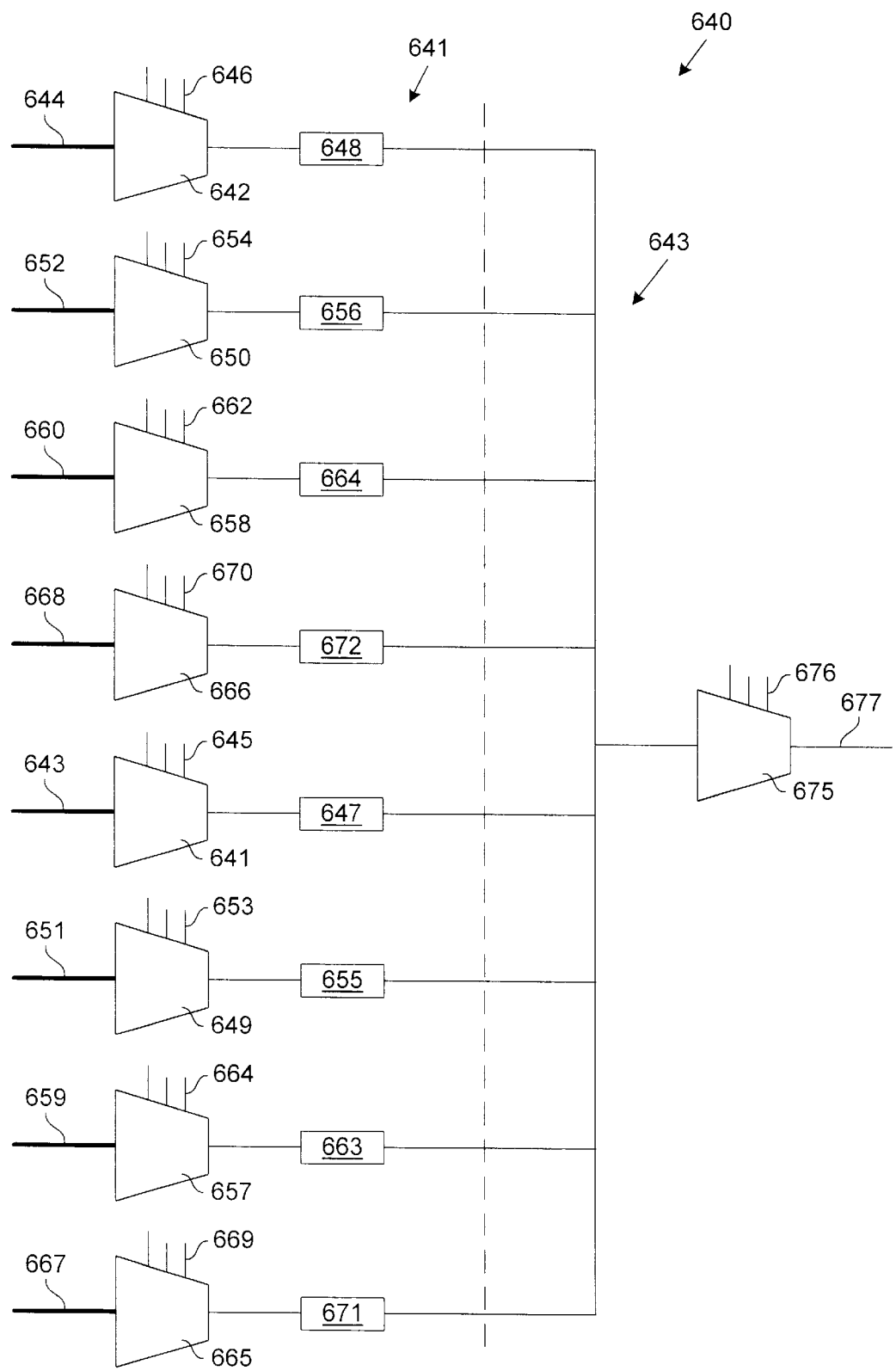
FIG. 6B is a block diagram of a 64 input multiplexer divided into eight isolated stages which can be compiled in parallel.

FIG. 6B is a block diagram of a multiplexer portion 640 of an electronic design. Multiplexer 640 having a first independent region 641 and a second independent region 643, isolated from one another by a registers. Thus during compilation of multiplexer 640, each of these independent regions can be compiled in parallel as a separate compilation task.

First region 641 includes eight 8:1 multiplexers. A first multiplexer 642 includes eight input lines 644 and three select lines 646. The input selected by multiplexer 642 is output and stored in a register 648. A second multiplexer 650 includes eight inputs 652, three select lines 654, and an output register 656. A third multiplexer 658 includes eight inputs 660, three select lines 662, and an output register 664. The remaining multiplexers in first region 641 are similarly configured.

In second region 643, a final 8:1 multiplexer 675 takes the outputs of the eight 8:1 multiplexers in first region 641 (from registers 648, 656, 664, 672, 647, 655, 663, and 671) and uses three new select lines 676 to output to a single answer on a line 677. The first set of 8:1 multiplexers (region 641) and the final 8:1 multiplexer (region 643) are completely separated from each other by the registers and thus can be synthesized in parallel. Note that the nine multiplexers depicted in FIG. 6B together define the equivalent of a single 64:1 multiplexer. If the three select lines employed in each multiplexer of the first region 641 are the same, then the equivalent 64:1 multiplexer takes 64 inputs and 6 select lines.

PRIORITY OF PARALLELISM

In general, it may be possible to parallelize a problem beyond the capabilities of the computing network. For example, given a device with 20 rows running on a machine with four CPUs, the compiler can only work on four rows at a time effectively. If there is a chance that some of the problems (row partitioning for example) may fail, then it is important to order the problems so that those with the highest priority of failure are run first. As a concrete example using the Altera FLEX 10K, the compiler partitions the design into rows, and then partitions each row into LABs. It is possible for a given row to not partition into LABs subject to the requirements of the amount of wire available to that row. If row 502*b* fails, for example, the compiler must stop all partitioning of rows into LABs, readjust the partition of the chip into rows, and then start over partitioning each row into LABs. If it was known before starting that row 502*b* has the highest probability of failure (e.g., because it failed last time with similar information or it has the most number of cells), then the compiler should allocate resources to work on it first. If this row was partitioned last, then the system may waste a large amount of time working on rows 502*a*, 502*c*, and 502*d*, only to throw out these results when row 502*b* fails.

This priority concept can also be applied to traditional non-hierarchical device architectures. After partitioning a device into two halves, the half that will be harder to legally place should be subdivided first in order to avoid wasted effort.

COMPUTER SYSTEM EMBODIMENT

Embodiments of the present invention as described above employ various process steps involving data stored in computer systems. These steps are those requiring physical manipulation of physical quantities. Usually, though not necessarily, these quantities take the form of electrical or magnetic signals capable of being stored, transferred, combined, compared, and otherwise manipulated. It is sometimes convenient, principally for reasons of common usage, to refer to these signals as bits, values, elements, variables, characters, data structures, or the like. It should be remembered, however, that all of these and similar terms are to be associated with the appropriate physical quantities and are merely convenient labels applied to these quantities.

Further, the manipulations performed are often referred to in terms such as identifying, fitting, or comparing. In any of the operations described herein that form part of the present invention these operations are machine operations. Useful machines for performing the operations of embodiments of the present invention include general purpose digital computers or other similar devices. In all cases, there should be borne in mind the distinction between the method of operations in operating a computer and the method of computation itself. Embodiments of the present invention relate to method steps for operating a computer in processing electrical or other physical signals to generate other desired physical signals.

Embodiments of the present invention also relate to an apparatus for performing these operations. This apparatus may be specially constructed for the required purposes, or it may be a general purpose computer selectively activated or reconfigured by a computer program stored in the computer. The processes presented herein are not inherently related to any particular computer or other apparatus. In particular, various general purpose machines may be used with programs written in accordance with the teachings herein, or it may be more convenient to construct a more specialized apparatus to perform the required method steps. The required structure for a variety of these machines will appear from the description given above.

In addition, embodiments of the present invention further relate to computer readable media that include program instructions for performing various computer-implemented operations. The media and program instructions may be those specially designed and constructed for the purposes of the present invention, or they may be of the kind well known and available to those having skill in the computer software arts. Examples of computer-readable media include, but are not limited to, magnetic media such as hard disks, floppy disks, and magnetic tape; optical media such as CD-ROM disks; magneto-optical media such as floptical disks; and hardware devices that are specially configured to store and perform program instructions, such as read-only memory devices (ROM) and random access memory (RAM). Examples of program instructions include both machine code, such as produced by a compiler, and files containing higher level code that may be executed by the computer using an interpreter.

Figure 7:
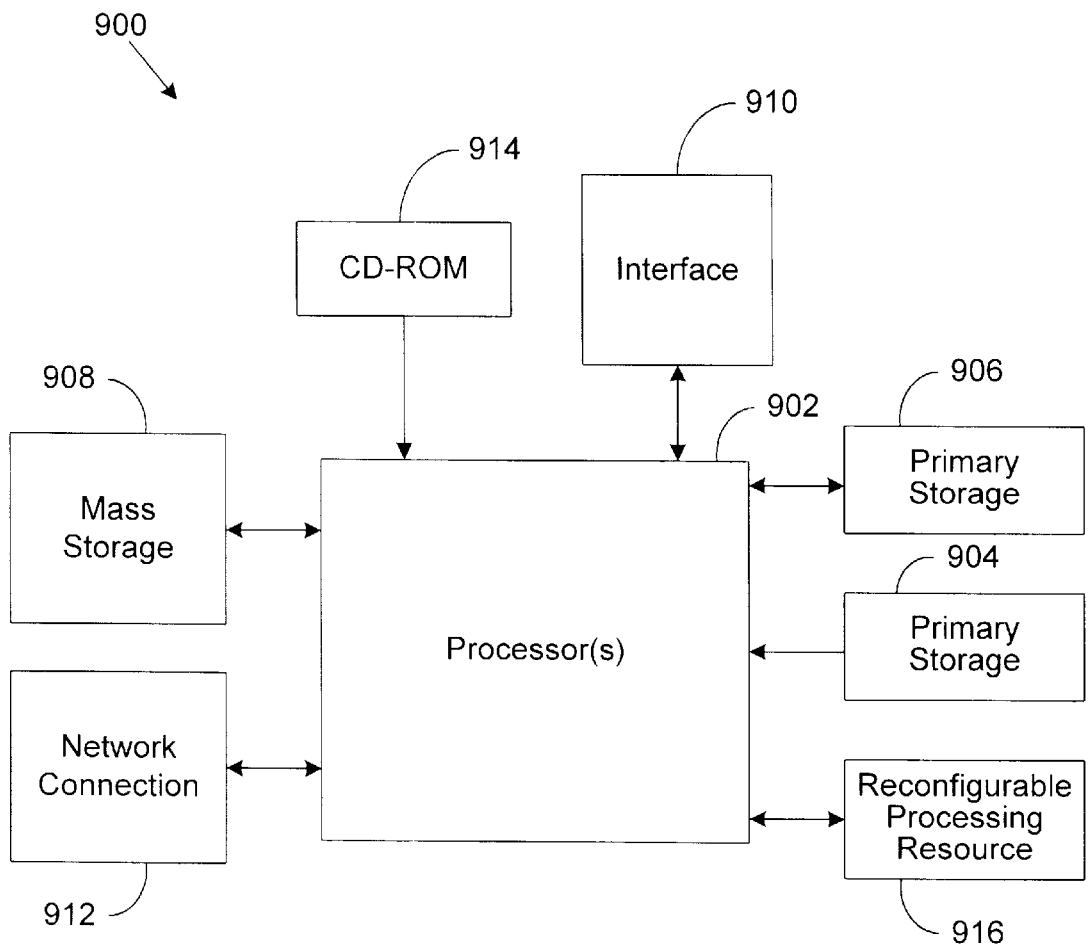
FIG. 7 is a block diagram of a typical computer system suitable for implementing an embodiment of the present invention.

FIG. 7 illustrates a typical computer system in accordance with an embodiment of the present invention. The computer system 900 includes any number of processors 902 (also referred to as central processing units, or CPUs) that are coupled to storage devices including primary storage 906 (typically a random access memory, or RAM), primary storage 904 (typically a read only memory, or ROM). As is well known in the art, primary storage 904 acts to transfer data and instructions unidirectionally to the CPU and primary storage 906 is used typically to transfer data and instructions in a bi-directional manner. Both of these primary storage devices may include any suitable of the computer-readable media described above. A mass storage device 908 is also coupled bi-directionally to CPU 902 and provides additional data storage capacity and may include any of the computer-readable media described above. The mass storage device 908 may be used to store programs, data and the like and is typically a secondary storage medium such as a hard disk that is slower than primary storage. It will be appreciated that the information retained within the mass storage device 908, may, in appropriate cases, be incorporated in standard fashion as part of primary storage 906 as virtual memory. A specific mass storage device such as a CD-ROM 914 may also pass data uni-directionally to the CPU.

CPU 902 is also coupled to an interface 910 that includes one or more input/output devices such as such as video monitors, track balls, mice, keyboards, microphones, touch-sensitive displays, transducer card readers, magnetic or paper tape readers, tablets, styluses, voice or handwriting recognizers, or other well-known input devices such as, of course, other computers. In addition, CPU 902 optionally may be coupled to a computer or telecommunications network using a network connection as shown generally at 912. With such a network connection, it is contemplated that the CPU might receive information from the network, or might output information to the network in the course of performing the above-described method steps. Finally, CPU 902 optionally may be coupled to a reconfigurable processing board 916 as described above. Board 916 may be called upon to execute certain computationally intensive processes for which it is programmed. The above-described devices and materials will be familiar to those of skill in the computer hardware and software arts.

Figure 8:
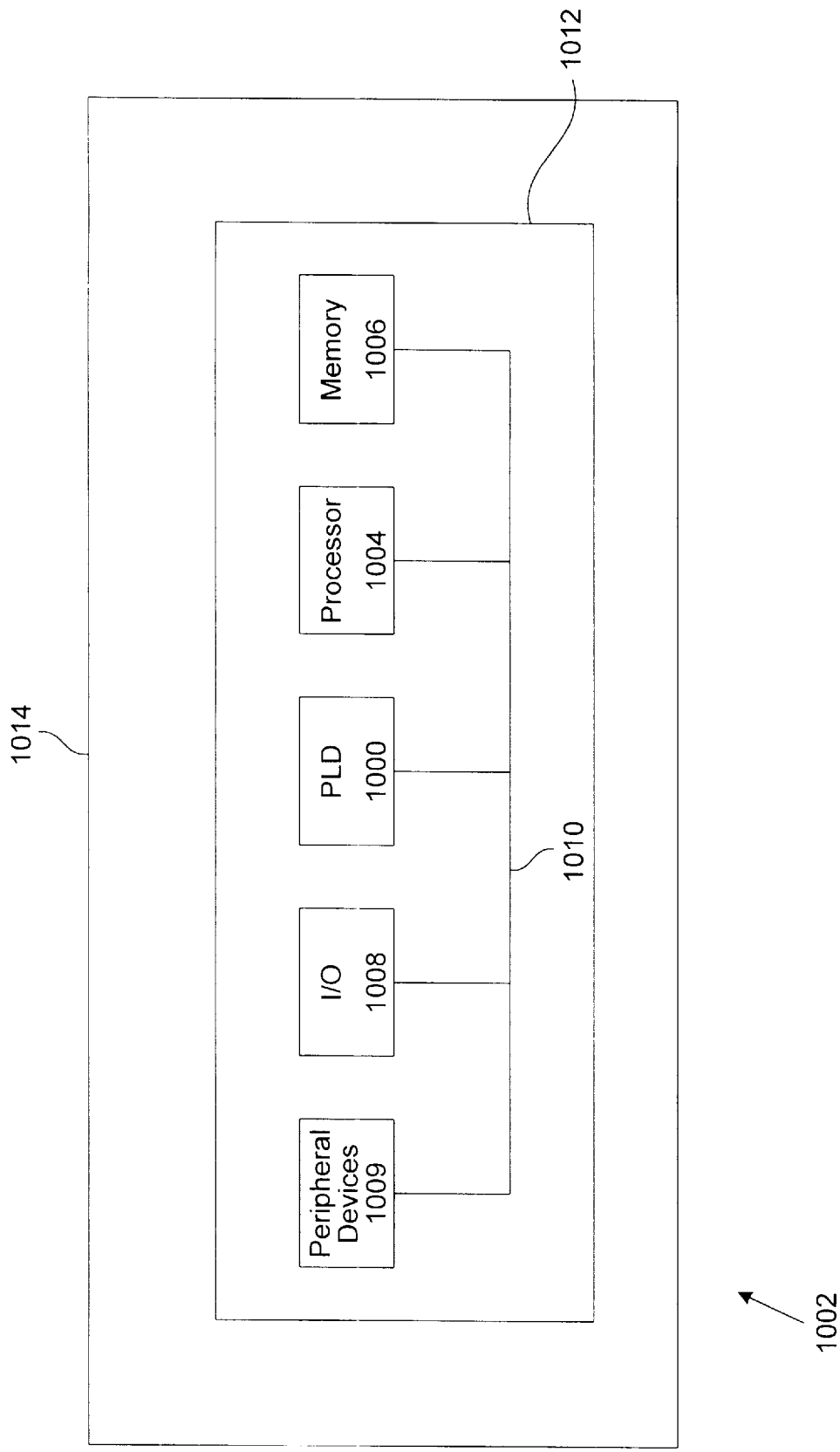
FIG. 8 illustrates a CPLD of the present invention in a data processing system.

This invention also relates to programmable logic devices programmed with a design prepared in accordance with the above described methods. The invention further relates to systems employing such programmable logic devices. FIG. 8 illustrates a PLD 1000 of the present invention in a data processing system 1002. The data processing system 1002 may include one or more of the following components: a processor 1004; memory 1006; I/O circuitry 1008, and peripheral devices 1009. These components are coupled together by a system bus 1010 and are populated on a circuit board 1012 which is contained in an end-user system 1014.

The system 1002 can be used in a wide variety of applications, such as computer networking, data networking, instrumentation, video processing, digital signal processing, or any other application where the advantage of using reprogrammable logic is desirable. The PLD 1000 can be used to perform a variety of different logic functions. For example, PLD 1000 can be configured as a processor or controller that works in cooperation with processor 1004. The PLD 1000 may also be used as an arbiter for arbitrating access to a shared resource in the system 1002. In yet another example, the PLD 1000 can be configured as an interface between the processor 1004 and one of the other components in the system 1002. It should be noted that the system 1002 is only exemplary, and that the true scope and spirit of the invention should be indicated by the following claims.

The foregoing describes the instant invention and its presently preferred embodiments. Numerous modifications and variations in the practice of this invention are expected to occur to those skilled in the art. For instance, the present invention may be implemented on one computer having one processor, on one computer having multiple processors, on different computers, and may take the form of instructions transmitted via a network connection such as an intranet or internet. In addition, the technique and system of the present invention is suitable for use with a wide variety of EDA tools and methodologies for programming a device. Therefore, the described embodiments should be taken as illustrative and not restrictive, and the invention should not be limited to the details given herein but should be defined by the following claims and their full scope of equivalents.

What is claimed is:

1. In a compiler that compiles an electronic design to define a fitting of the electronic design on one or more target hardware devices, the electronic design having a logical hierarchical structure including parent logical entities and children logical entities, a method of compiling with parallel processing, the method comprising:

providing a compilation project including (i) a first compilation task associated with a first child logical entity and (ii) a second compilation task associated with the second child logical entity;

allocating a first processing resource for running the first compilation task;

allocating a second processing resource, which is separate from the first processing resource, for running the second compilation task; and contemporaneously running the fit compilation task on the first processing resource and running the second compilation task on the second processing resource, wherein the first compilation task associated with the first child logical entity comprises: (a) mapping the first child logical entity into a plurality of logic cells representing discrete units of logic to be implemented on discrete logic elements on the one or more target hardware devices, (b) providing a partitioning project for grouping the individual logic cells into blocks of proximate logic elements, the partitioning project including (i) a first partitioning task including performing a bipartitioning routine on a fist pair of blocks of the logic elements of the one or more target hardware devices and (ii) a second partitioning task including performing said bipartitioning routine on a second pair of blocks, different from the first pair, of the logic elements of the one or more target hardware devices, and (c) contemporaneously running the first and second partitioning tasks, wherein the bipartitioning algorithm includes swapping the logic cells between individual blocks of the pairs of blocks to reduce the number of signal crossings between blocks, and wherein the first and second child logical entities are (i) isolated from one another by one or more resisters, (ii) represent separate stages of pipelined logic, (iii) are separated by a state machine, or (iv) are separate regions identified for resynthesis during incremental compilation.

2. The method of claim 1, wherein the first compilation task includes synthesizing logic of the first child logical entity.

3. The method of claim 2, wherein the logic being synthesized comprises a netlist.

4. The method of claim 1, wherein the first compilation task includes netlist extraction of logic for the first child logical entity.

5. The method of claim 1, further comprising:

determining that a third compilation task exists within the first compilation task;

allocating a third processing resource, separate from the first processing resource, for running the third compilation task; and running the third compilation task on the third processing resource contemporaneously with running of the first compilation task on the first processing resource.

6. The method of claim 1, wherein at least one of the first and second processing resources comprises at least one of a central processing unit and a reconfigurable processing resource.

7. A programmable logic device containing the electronic design as compiled according to the method recited in claim 1.

8. In a compiler that compiles an electronic design to define a partitioning of the electronic design on one or more target hardware devices, a method of compiling with parallel processing, the method comprising:

mapping a logic design into a plurality of logic cells representing discrete units of logic to be implemented on discrete logic elements on the one or more target hardware devices;

defining first and second independent regions of the electronic design;

providing a partitioning project for grouping the individual logic cells into regions of proximate logic elements, the partitioning project including (i) a first compilation task including performing a bipartitioning routine on a first pair of regions of the logic elements within the first independent region of the one or more target hardware devices and (ii) a second compilation task including performing said bipartitioning routine on a second pair of regions, different from the first pair, of the logic elements within the second independent region of the one or more target hardware devices;

allocating a first processing resource for running the first compilation task;

allocating a second processing resource, which is separate from the first processing resource, for determining the second compilation task;

contemporaneously running the first compilation task on the first processing resource and running the second compilation task on the second processing resource, wherein the bipartitioning algorithm includes swapping the logic cells between individual regions of the pairs of regions to reduce the number of signal crossings between regions; and fitting the logic cells that have been partitioned, into regions of the one or more target hardware devices corresponding to the pairs of regions of the electronic design, wherein the first and second independent regions are (i) isolated from one another by one or more registers, (ii) represent separate stages of pipelined logic, (iii) are separated by a state machine, or (iv) are separate regions identified for resynthesis during incremental compilation.

9. The method of claim 8, wherein the compilation project includes partitioning the electronic design between at least three regions of the one or more target hardware devices, and wherein the first compilation task includes performing a bipartitioning routine on a first pair of the at least three regions of the one or more target hardware devices, and wherein the second compilation task includes performing said bipartitioning routine on a second pair, different from the first pair, of the at least three regions of the one or more target hardware devices.

10. The method of claim 8, wherein the compilation project includes fitting portions of the electronic design onto at least two regions of the one or more target hardware devices, and wherein the first compilation task includes fitting a first portion of the electronic design on a first region of the one or more target hardware devices, and wherein the second compilation task includes fitting a second portion of the electronic design on a second region of the one or more target hardware devices.

11. The method of claim 10, wherein the first region of the one or more target hardware device is a first row of a target hardware device, and wherein the second region of the target hardware device is a second row of the target hardware device.

12. The method of claim 10, wherein the first region of the one or more target hardware device is a first target hardware device, and wherein the second region of the target hardware device is a second target hardware device.

13. The method of claim 8, wherein the target hardware device has a hierarchical architecture.

14. The method of claim 8, wherein the target hardware device has a flat architecture.

15. The method of claim 8, wherein at least one of the first and second processing resources comprises at least one of a central processing unit and a reconfigurable processing resource.

16. A programmable logic device implementing the electronic design compiled according to the method recited in claim 8.

17. The method of claim 8, wherein fitting the logic cells comprises fitting logic cells from a first partition contemporaneously with fitting logic cells from a second partition.

18. In a compiler that compiles an electronic design to define a fitting of the electronic design on one or more target hardware devices, the electronic design having a logical structure including independent regions of logic isolated from one another, a method of compiling with parallel processing, the method comprising:

defining first and second independent regions of the electronic design;

providing a compilation project including (i) a first compilation task associated with the first independent region of the electronic design and (ii) a second compilation task associated with the second independent region of the electronic design, wherein the first and second compilation tasks each comprise first mapping the design into a plurality of logic cells representing discrete units of logic to be implemented on discrete logic elements on the one or more target hardware devices, then partitioning, and then fitting the independent regions of logic to the one or more target hardware devices;

allocating a first processing resource for running the first compilation task;

allocating a second processing resource, which is separate from the first processing resource, for running the second compilation task; and contemporaneously running the first compilation task on the first processing resource and running the second compilation task on the second processing resource, wherein the first and second independent regions are (i) isolated from one another by one, or more registers, (ii) represent separate stages of pipelined logic, (iii) are separated by a state machine, or (iv) are separate regions identified for resynthesis during incremental compilation; and wherein the partitioning comprises performing a bipartitioning algorithm that groups the individual logic cells into blocks of proximate logic elements by swapping the logic cells between individual blocks of the pairs of blocks to reduce the number of signal crossings between blocks.

19. The method of claim 18, wherein the first and second independent regions of the electronic design are isolated from one another by one or more registers.

20. The method of claim 18, wherein the first and second independent regions include stages of pipelined logic.

21. The method of claim 18, wherein the first and second independent regions are separated by a state machine.

22. The method of claim 18, wherein the first and second independent regions are separate regions identified for resynthesis during incremental compilation.

23. The method of claim 18, wherein at least one of the first and second processing resources comprise at least one of a central processing unit and a reconfigurable processing resource.

24. A programmable logic device implementing the electronic design as compiled according to the method recited in claim 18.

25. A machine readable medium containing instructions for controlling a compiler that compiles an electronic design to define a fitting of the electronic design on one or more target hardware devices, the electronic design having a logical hierarchical structure including parent logical entities and children logical entities, the instructions specifying a method of compiling with parallel processing which comprises:

providing a compilation project including (i) a first compilation task associated with a first child logical entity and (ii) a second compilation task associated with the second child logical entity;

allocating a first processing resource for running the first compilation task;

allocating a second processing resource, which is separate from the first processing resource, for running the second compilation task; and contemporaneously running the first compilation task on the first processing resource and running the second compilation task on the second processing resource, wherein the first compilation task associated with the first child logical entity comprises: (a) mapping the first child logical entity into a plurality of logic cells representing discrete units of logic to be implemented on discrete logic elements on the one or more target hardware devices, (b) providing a partitioning project for grouping the individual logic cells into blocks of proximate logic elements, the partitioning project including (i) a first partitioning task including performing a bipartitioning routine on a first pair of blocks of the logic elements of the one or more target hardware devices and (ii) a second partitioning task including performing said bipartitioning routine on a second pair of blocks, different from the first pair, of the logic elements of the one or more target hardware devices, and (c) contemporaneously running the first and second partitioning tasks, wherein the bipartitioning algorithm includes swapping the logic cells between individual blocks of the pairs of blocks to reduce the number of signal crossings between blocks, and wherein the first and second child logic entities are (i) isolated from one another by one or more registers, (ii) represent separate stages of pipelined logic, (iii) are separated by a state machine, or (iv) are separate regions identified for resynthesis during incremental compilation.

26. The machine readable medium of claim 25, wherein the first compilation task includes synthesizing logic of the first child logical entity.

27. The machine readable medium of claim 25, wherein the first compilation task includes netlist extraction of logic for the first child logical entity.

28. A machine readable medium containing instructions for controlling a compiler that compiles an electronic design to define a partitioning of the electronic design on one or more target hardware devices, the instructions specifying a method of compiling with parallel processing which comprises:

mapping a logic design into a plurality of logic cells representing discrete units of logic to be implemented on discrete logic elements on the one or more target hardware devices;

defining first and second independent regions of the electronic design;

providing a partitioning project for grouping the individual logic cells into regions of proximate logic elements, the partitioning project including (i) a first compilation task including performing a bipartitioning routine on a first pair of regions of the logic elements within the first independent region of the one or more target hardware devices and (ii) a second compilation task including performing said bipartitioning routine on a second pair of regions, different from the first pair, of the logic elements within the second independent region of the one or more target hardware devices;

allocating a first processing resource for running the first compilation task;

allocating a second processing resource, which is separate from the first processing resource, for running the second compilation task;

contemporaneously running the first compilation task on the first processing resource and running the second compilation task on the second processing resource, wherein the bipartitioning algorithm includes swapping the logic cells between individual regions of the pairs of regions to reduce the number of signal crossings between regions; and fitting the logic cells that have been partitioned, into regions of the one or more target hardware devices corresponding to the pairs of regions of the electronic design, wherein the first and second independent regions are (i) isolated from one another by one or more registers, (ii) represent separate stages of pipelined logic, (iii) are separated by a state machine, or (iv) are separate regions identified for resynthesis during incremental compilation.

29. The machine readable medium of claim 28, wherein the compilation project includes partitioning the electronic design between at least three regions of the one or more target hardware devices, and wherein the first compilation task includes performing a bipartitioning routine on a first pair or the at least three regions of the one or more target hardware devices, and wherein the second compilation task includes performing said bipartitioning routine on a second pair, different from the first pair, of the at least three regions of the one or more target hardware devices.

30. The machine readable medium of claim 28, wherein the compilation project includes fitting portions of the electronic design onto at least two regions of the one or more target hardware devices, and wherein the first compilation task includes fitting a first portion of the electronic design on a first region of the one or more target hardware devices, and wherein the second compilation task includes fitting a second portion of the electronic design on a second region of the one or more target hardware devices.

31. The machine readable medium of claim 28, wherein the first region of the one or more target hardware device is a first target hardware device, and wherein the second region of the target hardware device is a second target hardware device.

32. A machine readable medium containing instructions for controlling a compiler that compiles an electronic design to define a fitting of the electronic design on one or more target hardware devices, the electronic design having a logical structure including independent regions of logic isolated from one another, the instructions specifying a method of compiling with parallel processing which comprises:

defining first and second independent regions of the electronic design;

providing a compilation project including (i) a first compilation task associated with the first independent region of the electronic design and (ii) a second compilation task associated with the second independent region of the electronic design, wherein the first and second compilation tasks each comprise first mapping the design into a plurality of logic cells representing discrete units of logic to be implemented on discrete logic elements on the one or more target hardware devices, then partitioning, and then fitting the independent regions of logic to the one or more target hardware devices;

allocating a first processing resource for running the first compilation task;

allocating a second processing resource, which is separate from the first processing resource, for running the second compilation task; and contemporaneously running the first compilation task on the first processing resource and running the second compilation task on the second processing resource, wherein the first and second independent regions are (i) isolated from one another by one or more registers, (ii) represent separate stages of pipelined logic, (iii) are separated by a state machine, or (iv) are separate regions identified for resynthesis during incremental compilation.

wherein the partitioning comprises performing a bipartitioning algorithm that groups the individual logic cells into blocks of proximate logic elements by swapping the logic cells between individual blocks of the pairs of blocks to reduce the number of signal crossings between blocks.

33. The machine readable medium of claim 32, wherein the first and second independent regions of the electronic design are isolated from one another by one or more registers.

34. The machine readable medium of claim 32, wherein the first and second independent regions include stages of pipelined logic.

35. The machine readable medium of claim 32, wherein the first and second independent regions are separated by a state machine.

* * * * *